US010381803B2

(12) United States Patent
Dallesasse et al.

(10) Patent No.: US 10,381,803 B2
(45) Date of Patent: *Aug. 13, 2019

(54) MODE CONTROL IN VERTICAL-CAVITY SURFACE-EMITTING LASERS

(71) Applicant: THE BOARD OF TRUSTEES OF THE UNIVERSITY OF ILLINOIS, Urbana, IL (US)

(72) Inventors: John Michael Dallesasse, Geneva, IL (US); Benjamin Kesler, Champaign, IL (US); Thomas O'Brien, Jr., Champaign, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/677,810

(22) Filed: Aug. 15, 2017

(65) Prior Publication Data

US 2018/0041010 A1 Feb. 8, 2018

Related U.S. Application Data

(62) Division of application No. 14/933,716, filed on Nov. 5, 2015, now Pat. No. 9,742,154.
(Continued)

(51) Int. Cl.
*H01S 5/00* (2006.01)
*H01S 5/183* (2006.01)
(Continued)

(52) U.S. Cl.
CPC ...... *H01S 5/18394* (2013.01); *H01S 5/18333* (2013.01); *H01S 5/125* (2013.01);
(Continued)

(58) Field of Classification Search
CPC ............ H01S 5/18333; H01S 5/18394; H01S 5/18311; H01S 5/18369; H01S 5/2063;
(Continued)

(56) References Cited

U.S. PATENT DOCUMENTS 9,742,154 B2 * 8/2017 Dallesasse .......... H01S 5/18333
2002/0150135 A1 * 10/2002 Naone .................... B82Y 20/00
372/45.011

(Continued)

OTHER PUBLICATIONS

Chen, "Stable Single-Mode Operation of an 850-nm VCSEL with a Higher Order Mode Absorber Formed by Shallow Zn Diffusion", 2001.
(Continued)

*Primary Examiner* — Kinam Park
(74) *Attorney, Agent, or Firm* — Guntin & Gust, PLC; Douglas Schnabel

(57) ABSTRACT

Aspects of the subject disclosure may include, for example, a first distributed Bragg reflector, a second distributed Bragg reflector, an active region with an oxide aperture between the first and second distributed Bragg reflectors, and a dielectric layer, where a positioning of the dielectric layer with respect to the first and second distributed Bragg reflectors and the oxide aperture causes suppression of higher modes of the vertical-cavity surface-emitting laser device. Other embodiments are disclosed.

20 Claims, 28 Drawing Sheets

Related U.S. Application Data

(60) Provisional application No. 62/076,038, filed on Nov. 6, 2014.

(51) Int. Cl.
    *H01S 5/125* (2006.01)
    *H01S 5/187* (2006.01)
    *H01S 5/20* (2006.01)

(52) U.S. Cl.
    CPC ............... *H01S 5/183* (2013.01); *H01S 5/187* (2013.01); *H01S 5/18311* (2013.01); *H01S 5/18313* (2013.01); *H01S 5/18369* (2013.01); *H01S 5/2063* (2013.01); *H01S 5/2072* (2013.01); *H01S 2301/166* (2013.01)

(58) Field of Classification Search
    CPC ........ H01S 5/2072; H01S 5/183; H01S 5/187; H01S 5/125; H01S 5/18313; H01S 2301/166
    See application file for complete search history.

(56) References Cited

U.S. PATENT DOCUMENTS

| | | | |
|---|---|---|---|
| 2007/0091959 A1* | 4/2007 | Royo | H01S 5/18344 |
| | | | 372/50.124 |
| 2008/0219307 A1* | 9/2008 | Birkedal | H01S 5/183 |
| | | | 372/44.01 |
| 2016/0134083 A1 | 5/2016 | Dallesasse | |

OTHER PUBLICATIONS

Floyd, "Suppression of Higher-Order Transverse Modes in Vertical-Cavity Lasers by Impurity-Induce Disordering", 1995.

Grundl, "Record Single-Mode, High-Power VCSELs by Inhibition of Spatial Hole Burning", 2013.

Haglund, "Single Fundamental-Mode Output Power Exceeding 6 mW From VCSELs With a Shallow Surface Relief", 2004.

Shi, "High-Power and High-Speed Zn-Diffusion Single Fundamental-Mode Vertical-Cavity Surface-Emitting Lasers at 850-nm Wavelength", 2008.

Soderberg, "Suppression of Higher Order Transverse and Oxide Modes in 1.3um InGaAs VCSELs by an Inverted Surface Relief", 2007.

* cited by examiner

800

1400

2600

- Measure with current thermocouple in MNTL 2111
  - Type K
- Set point 575C
- Target 600C

MODE CONTROL IN VERTICAL-CAVITY SURFACE-EMITTING LASERS

CROSS-REFERENCE TO RELATED APPLICATIONS

This application is a divisional of and claims priority to U.S. patent application Ser. No. 14/933,716, filed Nov. 5, 2015, which claims priority to U.S. Provisional Patent Application No. 62/076,038 filed on Nov. 6, 2014. All sections of the aforementioned applications are incorporated herein by reference in their entirety.

FIELD OF THE DISCLOSURE

The subject disclosure relates to mode control in vertical-cavity surface-emitting lasers.

BACKGROUND

Vertical-Cavity Surface-Emitting Lasers (VCSELs) capable of high-power operation with precisely controlled transverse mode characteristics are becoming increasingly important in a variety of applications such as optical communications, position sensors, printing, and magnetic storage. In optical communications applications, differences in rise and fall times associated with specific spatial modes can lead to deterministic jitter. This problem can be exacerbated when VCSELs are coupled into multimode fibers, where differential mode delay (DMD) is also present. These factors can limit link speed and distance in data centers and enterprise networks.

A technique that has been used for mode suppression in VCSELs has been a surface relief method (or inverted surface relief method depending on the location of the etching). In the surface relief method, a layer of GaAs is grown on top of a regular VCSEL epitaxial structure. By itself the extra GaAs layer serves as an anti-phase layer when viewed from the cavity, which means that it perturbs the standing wave at both the top-DBR/GaAs interface and GaAs/air interface. This perturbation results in destructive interference for any portion of the standing wave of a transverse mode that impinges on the GaAs, increasing the cavity loss for said mode. There are inherent problems with using an extra GaAs layer as the phase-mismatch layer. The first is that the GaAs layer is produced in the epitaxial growth process as part of the VCSEL device structure. This means that the VCSEL layer structure must be used for this mode-suppression application only, as it has been designed to suppress lasing if not modified in the fabrication process. If part of the top GaAs layer is not removed, the entire laser will be affected by the anti-phase reflection and lasing will be suppressed. The second problem arises during the desired patterning and removal of specific portions of the GaAs anti-phase layer. Since it is desired that the fundamental mode be as unperturbed as possible, the centermost portion of the VCSEL anti-phase layer must be removed. However, this requires a very precise etch with limited options that would be acceptable for volume production. One possible method is via a wet chemical etch. However, since it is not practical to include an etch-stop below the anti-phase GaAs layer, a rigorously controlled process must be developed, and any deviation from the desired time, temperature, or chemical composition of the wet etch could ruin the VCSEL. The second possible method is via Ar-ion (or other heavy-ion) milling. This technique, though very precise in the etch depths that it can achieve, can cause significant damage to the top reflector DBR stack of the sample, leading to undesirable increases in defect density, scattering sites, or absorption loss, decreasing the performance of the VCSEL. Ion milling is generally not considered an acceptable wafer processing method, but does have utility for diagnostics.

Another technique for mode-suppression in VCSELs utilizes DBR regrowth on top of a patterned surface, or a Buried-Tunnel-Junction (BTJ), to achieve the phase-mismatch condition. These methods of regrowth utilize the same phase mismatch phenomenon as the surface relief technique and the proposed amorphous silicon thin film deposition, yet they require much more precise methods of fabrication that must occur during the middle of the layer structure growth itself. Growth is halted, typically after the first pair of the p-type top DBR is grown, and an extra, phase-mismatch layer is grown (either the BTJ layer or an extra half-pair of DBR). The sample is then removed from the growth chamber, patterned and etched to produce the desired structure (typically a disk or donut), then cleaned thoroughly and placed back into the chamber to resume growth.

BRIEF DESCRIPTION OF THE DRAWINGS

Reference will now be made to the accompanying drawings, which are not necessarily drawn to scale, and wherein.

DETAILED DESCRIPTION

The subject disclosure describes, among other things, illustrative embodiments for VCSELs and methods of manufacturing these VCSELs such that higher order modes are suppressed. In one or more embodiments, the higher order modes can be suppressed while not substantially suppressing the fundamental mode so that the VCSEL operates as a single mode device. The suppression of the higher modes can be done using a dielectric filter, using a zinc diffusion region, using proton implantation, or a combination thereof. The techniques and components can be performed and added to an already formed VCSEL. Other embodiments are described in the subject disclosure.

One or more aspects of the subject disclosure include a vertical-cavity surface-emitting laser device that includes a first distributed Bragg reflector, a second distributed Bragg reflector, an active region with an oxide aperture between the first and second distributed Bragg reflectors, and a dielectric layer. A positioning of the dielectric layer with respect to the first and second distributed Bragg reflectors and the oxide aperture causes suppression of higher modes of the vertical-cavity surface-emitting laser device.

One or more aspects of the subject disclosure include a method of forming a vertical-cavity surface-emitting laser device. The method includes forming a first distributed Bragg reflector on a substrate, where the first distributed Bragg reflector is an n-type distributed Bragg reflector. The method includes forming an active region on the first distributed Bragg reflector, where the active region has an oxide aperture. The method includes forming a second distributed Bragg reflector on the active region, where the second distributed Bragg reflector is a p-type distributed Bragg reflector. The method includes providing a zinc diffusion region formed in a ring, where the zinc diffusion region is formed in a distal portion of the second distributed Bragg reflector. The distal portion is on an end of the second distributed Bragg reflector that is opposite to the active region, and the zinc diffusion region causes suppression of higher modes of the vertical-cavity surface-emitting laser device.

One or more aspects of the subject disclosure include a vertical-cavity surface-emitting laser device including a first distributed Bragg reflector, a second distributed Bragg reflector, an active region with an oxide aperture between the first and second distributed Bragg reflectors, and a dielectric layer, where the dielectric layer has an opening therethrough. A positioning of the dielectric layer and the opening with respect to the first and second distributed Bragg reflectors and the oxide aperture causes suppression of at least a first mode of the vertical-cavity surface-emitting laser device.

Figure 1:
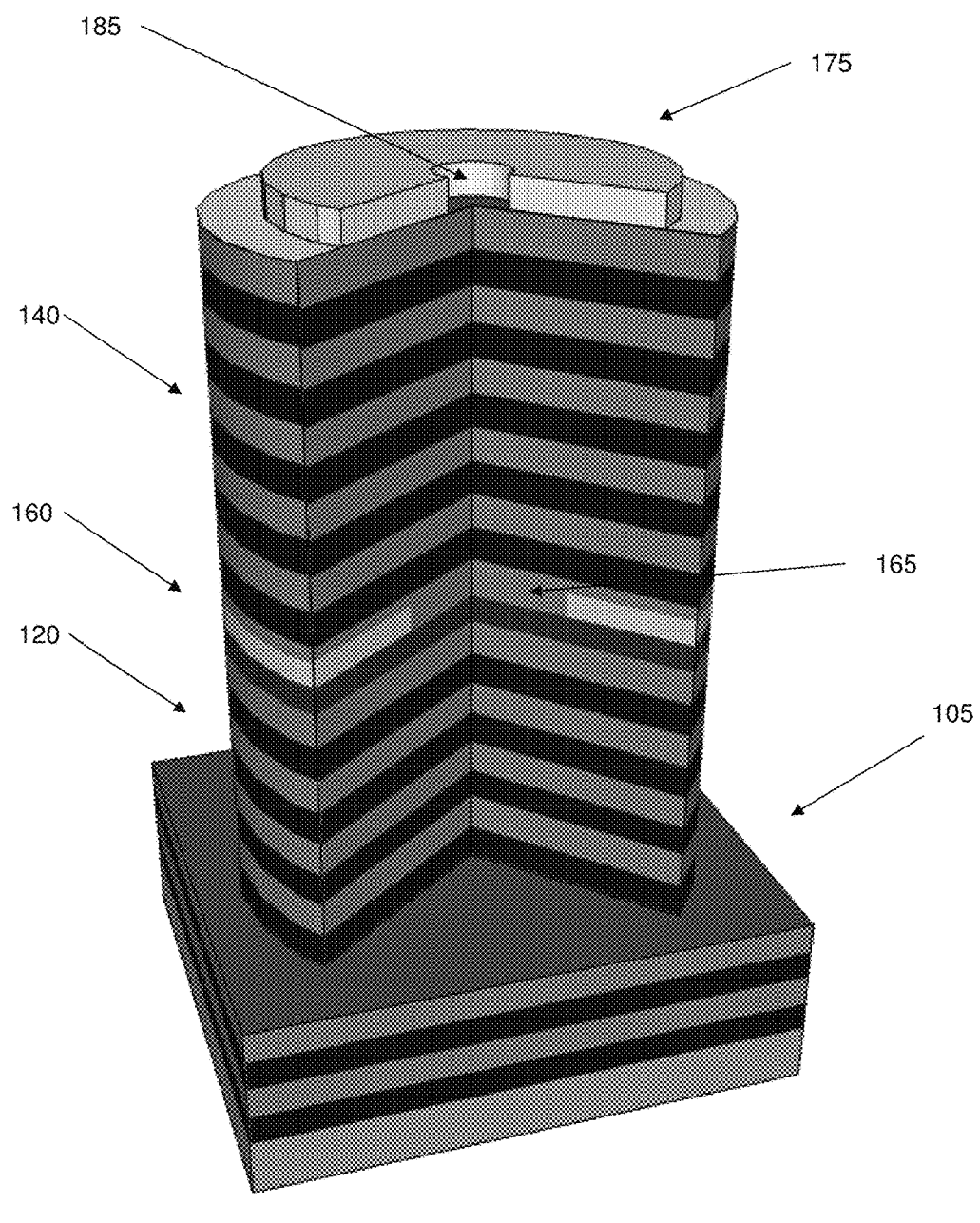
FIG. 1 depicts an illustrative embodiment of a VCSEL having a dielectric filter for suppression of higher modes.

FIG. 1 depicts an illustrative embodiment of a VCSEL 100 having a lower distributed Bragg reflector 120, an upper distributed Bragg reflector 140, and an active region 160 therebetween. The active region 160 includes an oxide aperture 165. The lower distributed Bragg reflector 120 can be formed on a substrate. In one embodiment, an n-contact 105 can be included, such as deposited on the substrate. As an example, the lower distributed Bragg reflector 120 can be an n-type distributed Bragg reflector such as formed from multiple layers of aluminum gallium arsenide (AlGaAs) and the upper distributed Bragg reflector 140 can be an p-type distributed Bragg reflector such as formed from multiple layers AlGaAs. The multiple layers of each of the distributed Bragg reflectors vary so as to provide the desired properties for the VCSEL.

The VCSEL 100 can include a dielectric layer 175 disposed on the top of the upper distributed Bragg reflector 140. In one embodiment, the dielectric layer can be formed on a p-contact of the upper distributed Bragg reflector 140. The dielectric layer can include an opening 185 therethrough. In one embodiment, the opening can be circular, although other shapes can also be utilized, such as elliptical (e.g., depending on the location of the fundamental mode of the VCSEL). The dielectric layer 175 and its opening 185 can be positioned with respect to the first and second distributed Bragg reflectors 120, 140 and the oxide aperture 165 so as to cause suppression of higher modes of the VCSEL 100 without suppression of a fundamental mode of the VCSEL. The dielectric layer can be disposed on the VCSEL 100 without epitaxially growing an additional semiconductor layer and without utilizing a precise etching process.

By adding a thin layer (e.g., less than 200 nm thick including about 70 nm thick) of amorphous silicon to the top of the VCSEL 100, it is possible to suppress portions of the lasing profile that are undesirable for applications that require a tightly focused beam of light. These undesirable portions can be the higher order modes of the laser and can differ from a desired fundamental mode in that their maximum intensity is off-axis from the center of the VCSEL 100 and their divergence angle is greater than that of a desired fundamental mode. The amorphous silicon, patterned in such a way as to avoid interaction with most or a majority of the fundamental mode profile, can create a disruptive feedback loop for the higher order modes through a phase perturbation. This results in the suppression of these modes, meaning that they will still lase, but at much higher input currents than before. By tailoring the pattern of the opening 185 in the amorphous silicon dielectric layer 175 as well as the size of the VCSEL 100, it is possible to have single (fundamental) mode lasing over a wide range of input currents. This can increase the single-mode output power of the VCSEL 100 to the point where it can be used in applications that have been traditionally dominated by larger laser types such as edge-emitters. Since VCSELs have a much smaller volume and output laser beam diameter compared to edge emitters, the creation of a high-power single-mode VCSEL 100 can facilitate the further miniaturization and storage capacity of computer hard drives which use a technology known as Energy Assisted Magnetic Recording, as well as being applied to other applications that utilize lasers.

Large area VCSELs allow for high power, yet they are inherently multi-mode in their spectral and spatial characteristics (i.e., their output consists of many different wavelengths that correspond to different spatial profiles). To make a single-spectral-spatial-mode VCSEL, smaller oxide apertures can be utilized, but they dramatically reduce output power. Depositing a dielectric filter (e.g., amorphous silicon layer 175) on top of the VCSEL 100 in a certain pattern 185, where the pattern is a function of the oxide aperture 165, increases the threshold gain of higher order modes compared to the first (fundamental) mode. This results in an inherent mode suppression since the higher order modes need a much larger input current to begin lasing. Thus, the fundamental mode not only lases first, but is also the only mode lasing over a significant range of currents, which increases the single-mode output power for large area VCSELs to levels higher than currently possible in small area VCSELs. VCSEL 100 enables use of a dielectric filter, such as a single thin dielectric layer (e.g., amorphous silicon) deposited on top of a fully fabricated VCSEL for use as a mode suppressant which avoids the need to utilize surface relief or inverted surface relief processes involving physical etching of the top DBR of the VCSEL or growth of many additional layers of semiconductor, which is a costly and difficult approach.

VCSEL 100 provides a thin dielectric film that suppresses higher order modes in large area VCSELs to the extent that the fundamental mode will lase for a wide range of input currents above the laser threshold. Using amorphous silicon as the dielectric filter 175 can be advantageous because it can be deposited and patterned after standard VCSEL processing via a simple lithography, electron-beam evaporation or plasma-assisted sputtering, and lift-off process. These steps are often utilized in the fabrication of many semiconductor devices so the process control can be closely monitored and replication facilitated. The deposition and patterning of the amorphous silicon can be a non-destructive process. The process of forming the dielectric layer 175 does not require precise etching of the VCSEL's upper distributed Bragg reflector 140, does not require ion implantation, and does not require high temperature diffusion processes, which are damaging to the semiconductor.

Also, the amorphous silicon filter 175 does not require epitaxial regrowth or precise etching techniques to achieve a phase-mismatch condition, meaning it can be used in a laboratory setting that does not have the benefit of personal MOCVD or MBE growth machines. The dielectric filter 175 (e.g., an amorphous silicon thin film) provides mode suppression while also not requiring expensive, difficult growth conditions and precise or damaging etching requirements that are present in past techniques utilizing phase-mismatch layers.

Figure 2:
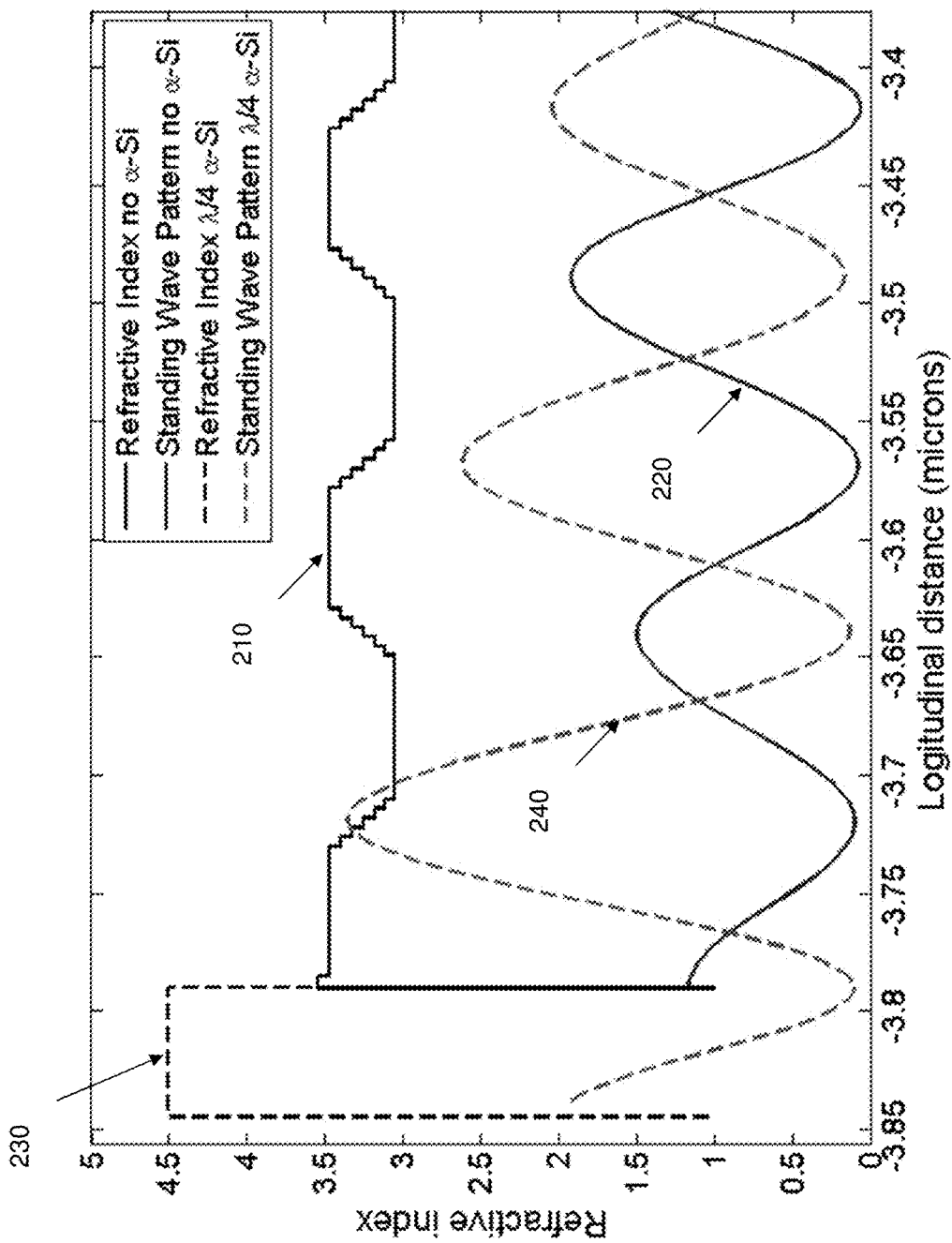
FIG. 2 depicts a graphical representation of refractive index (dashed black line) and standing wave pattern (red dashed line) for the VCSEL of FIG. 1 as well as a graphical representation of refractive index (solid black line) and standing wave pattern for (solid blue line) for a conventional VCSEL.

Referring to FIG. 2, the refractive index for the VCSEL 100 is illustrated as a function of the longitudinal distance. VCSEL 100 maintains a high reflectivity for the output mirror in the region of the opening 185 and greatly increases the threshold gain of the higher modes that overlap with the amorphous silicon filter 175.

The dielectric layer can be formed from various dielectric materials or combinations of materials. In one embodiment, amorphous silicon is utilized for the dielectric layer 175. For amorphous silicon, perturbation mainly occurs at the a-Si/GaAs interface, unlike silicon nitride, where perturbation occurs at the nitride/air interface meaning the amorphous silicon layer thickness tolerance is larger than a layer composed of silicon nitride, which would need to be a thickness equal to a quarter wavelength. Further, amorphous silicon can be easier to fabricate compared to silicon nitride or titanium dioxide (in one embodiment only lithography and e-beam evaporation are needed, no plasma etching). In another embodiment, a titanium dioxide pattern in the same form as an amorphous silicon pattern can be formed using lithography, e-beam evaporation or plasma-assisted sputtering and liftoff, however, the stoichiometry can be more difficult to control and the lower refractive index can make it less useful than amorphous silicon.

The dielectric filter 175 perturbs the phase of any field that overlaps the region covered by the filter. When using a material such as amorphous silicon, which has an index of around 4.5 at a wavelength of 980 nm, the phase of the field is perturbed at the semiconductor/amorphous silicon interface. This arises from how the standing wave pattern is set up from the perspective of the cavity. When the first half DBR pair outside of a cavity of this length is the higher refractive index DBR half pair (as it is in the case of the example layered structures), the field is set up such that an antinode occurs when going from a high refractive index half pair to low refractive index half pair, and a node occurs when going from a low refractive index half pair to a high refractive index half pair. Since the last layer before the VCSEL output is a high refractive index GaAs+ $Al_{0.12}Ga_{0.88}As$ hybrid half pair, the field formed at this semiconductor/air interface is at an antinode (which is seen as the solid lines 210, 220 in FIG. 2). However, when amorphous silicon is deposited on top of the semiconductor, from the perspective of the cavity, the semiconductor/dielectric interface is a low to high transition, meaning the field wants to form a node. The effect is attributed to a pi phase shift in the reflected wave from the incident wave, which is seen as the dashed lines 230, 240 in FIG. 2. FIG.

2 illustrates the index of refraction for the top interface of the VCSEL layer structure without (solid line 210) and with (dashed line 230) a quarter lambda amorphous silicon layer. The amorphous silicon perturbs the phase of the reflected wave by pi, forcing the field to a node (dashed line 240) instead of the typical antinode (solid line 220). This results in a reduced power reflectivity for modes with transverse field profiles that significantly overlap the amorphous silicon layer, thus increasing the material gain needed to lase.

Figure 3:
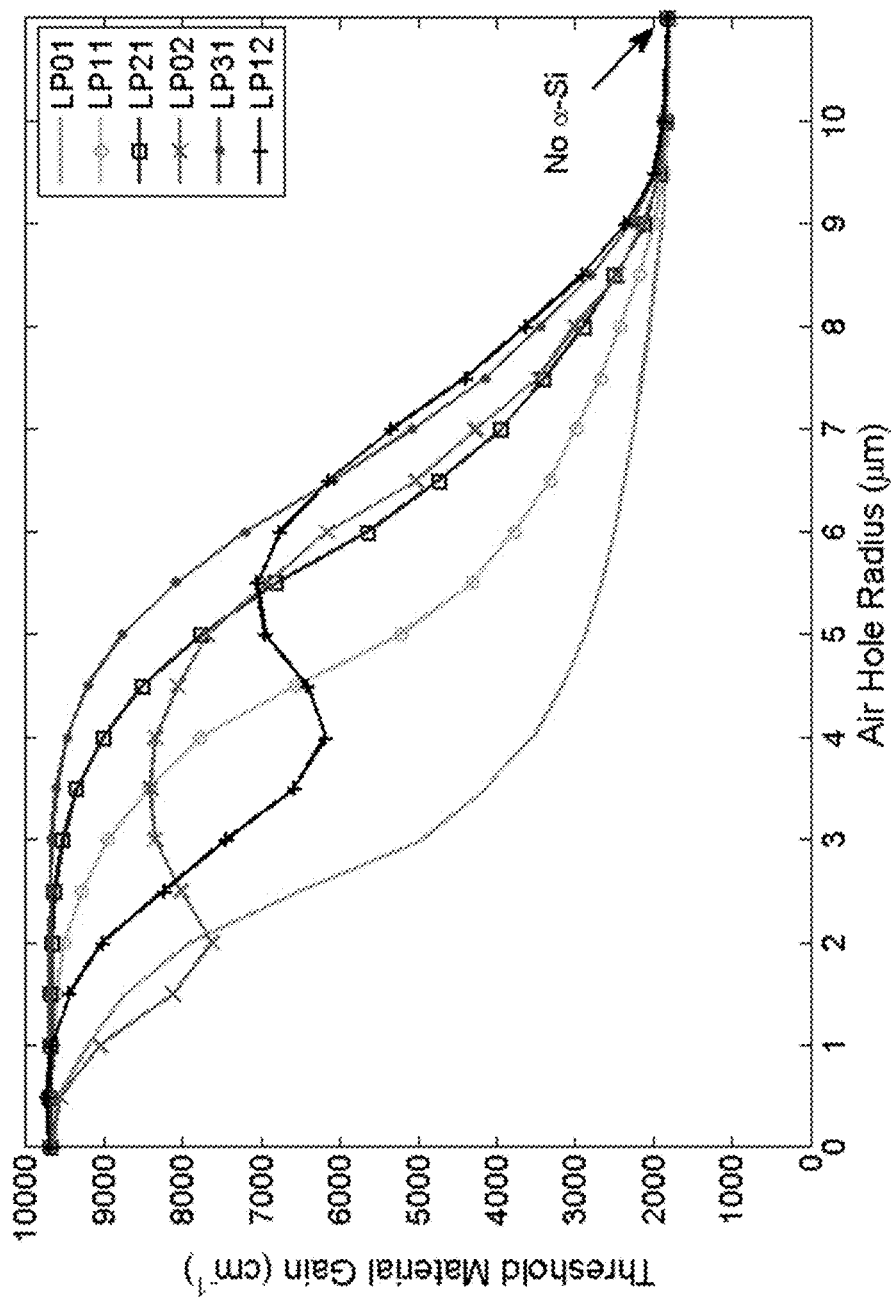
FIG. 3 depicts a graphical representation of threshold material gain as a function of air hole radius of the first 6 linearly polarized modes for the VCSEL of FIG. 1.

Referring to FIG. 3, a threshold material gain is illustrated for VCSEL 100 as a function of the air hole (opening 185) radius. A threshold material gain for the first six transverse VCSEL linearly polarized modes was plotted as a function of air hole radius with an oxide aperture radius of 10 µm. The theoretical maximum difference between any higher order mode and the fundamental mode occurred when the air radius is approximately 48% of the oxide aperture radius. The quarter-lambda thickness gave the best theoretical results (maximum destructive interference feedback). In FIG. 3, threshold material gain coefficients are illustrated for the first 6 linearly polarized (LP) modes, with LP01 being the fundamental order mode. When the radius of the air hole of a 10 µm radius oxide aperture VCSEL is approximately 4.5 µm, the difference in threshold material gain between the fundamental order and higher order modes is the largest.

FIG. 3 shows values that have been calculated assuming an oxide aperture radius of 10 µm, meaning that an air hole radius of 1 µm corresponds to amorphous silicon covering the entire device except for a circle of radius 1 µm in or near the center of (or concentrically aligned with) the oxide aperture (an air radius of 10 µm means there is no amorphous silicon inside the oxide aperture). As the air radius decreases, more of the transverse field of each mode "sees" the perturbation due to the amorphous silicon, leading to a reduction in power reflectivity and an increase in threshold material gain for the mode. At a certain air radius, in this case around 48 percent of the oxide aperture radius, the difference between the higher order threshold gain and fundamental mode threshold gain is a maximum.

For a VCSEL, a complex reflection coefficient for a single transverse mode has both a phase and amplitude component:

$$R = re^{i\varphi}$$

Perturbing the phase will also change the amplitude due to boundary conditions. In one or more embodiments, the dielectric filter can have a much more dramatic effect on higher order modes. All of the transverse modes (though fundamental less so) have increased total mirror loss with the filter due to the decreased in the reflection of the top mirror:

$$\alpha_m = \frac{1}{2L} \ln\left(\frac{1}{|R_{top}||R_{bottom}|}\right)$$

Threshold gain increases due to increased mirror loss (the modeling in FIG. 3 demonstrates this):

$$\Gamma g_{th} = \langle \alpha_i \rangle + \alpha_m$$

Increased threshold gain results in increased threshold current for given device size. Finally, slope of L-I curve increases due to increasing mirror loss:

$$P_{out} = \eta_i \frac{\hbar\omega}{q} \frac{\alpha_m}{\alpha_i + \alpha_m} (I - I_{th})$$

Figure 4:
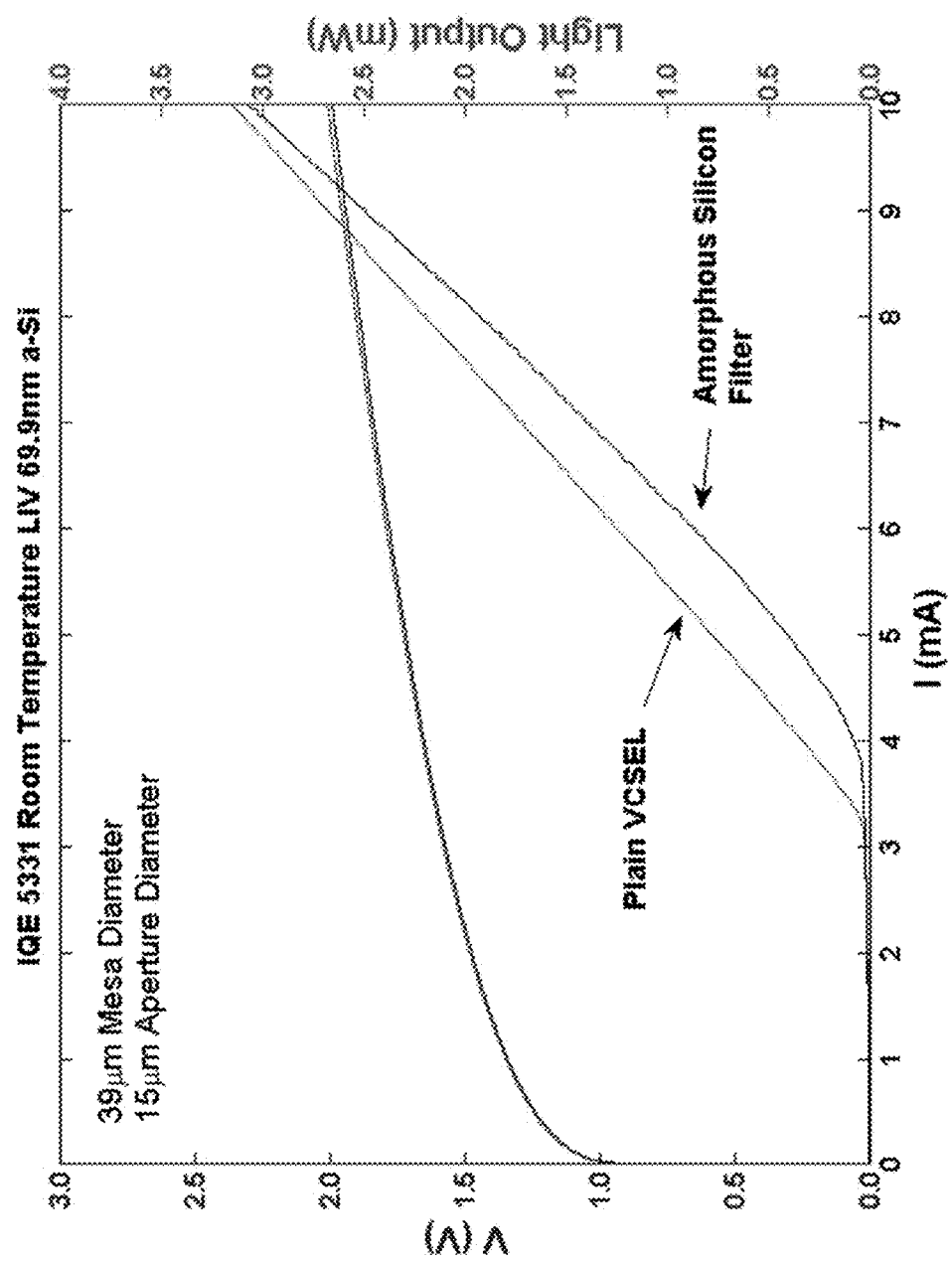
FIGS. 4-5 depict graphical representations of voltage and light output as a function of current for the VCSEL of FIG. 1.
Figure 5:
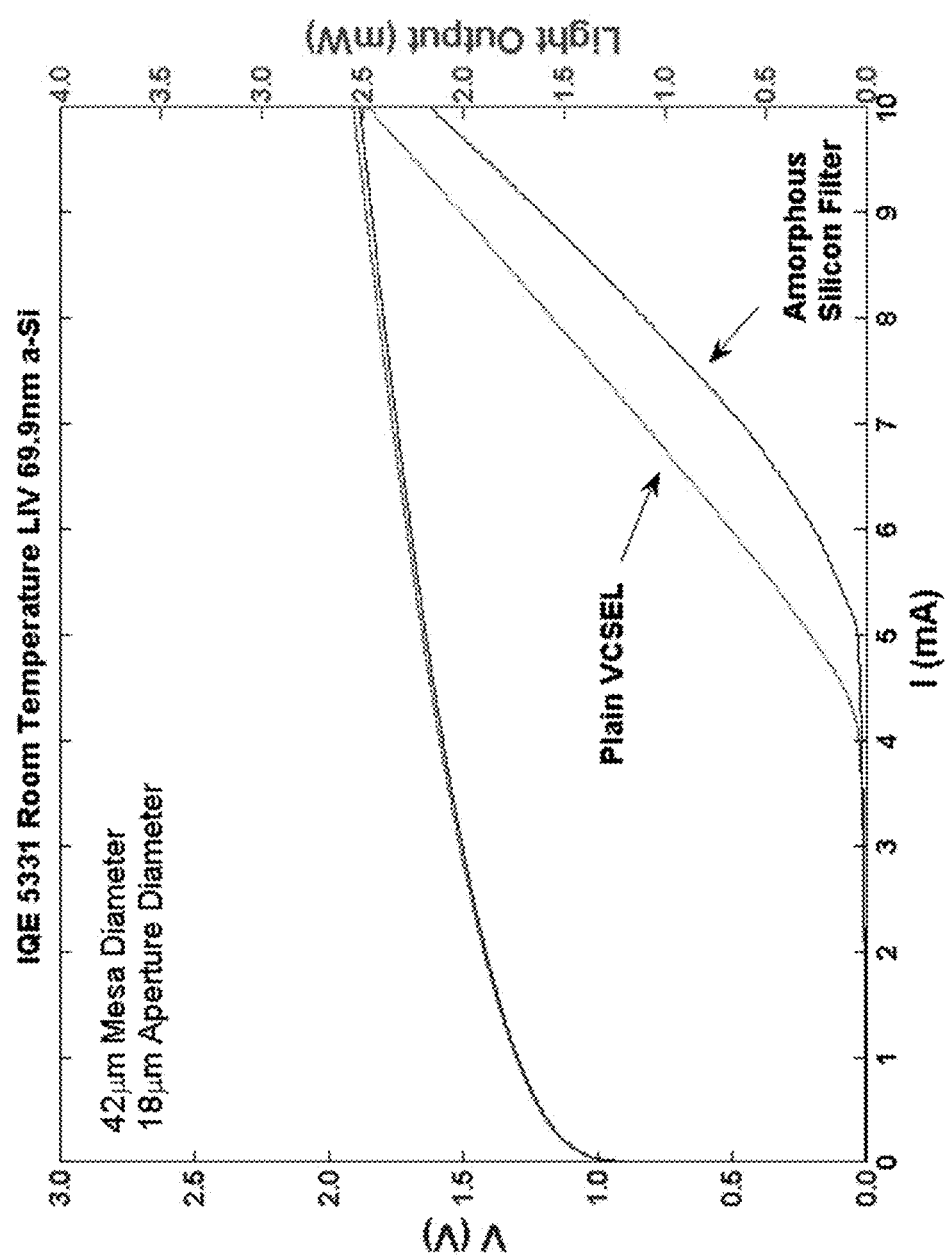
Figure 6:
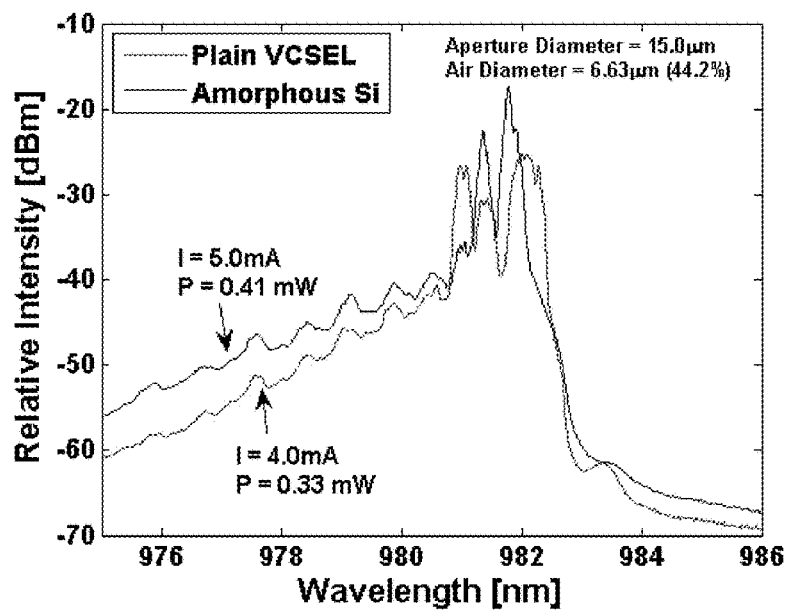
FIGS. 6-7 depict graphical representations of the output spectra (relative intensity versus wavelength) for the VCSEL of FIG. 1.
Figure 7:
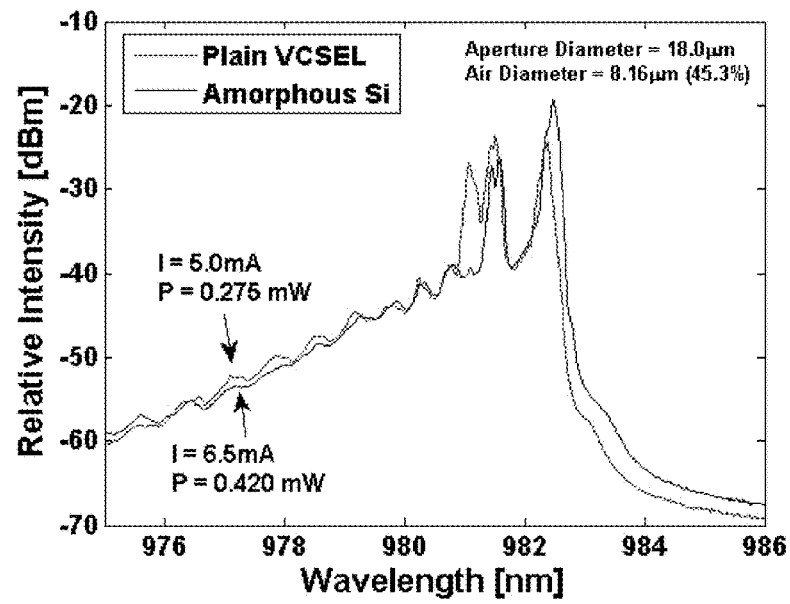

Referring to FIGS. 4-5, L-I-V curves for large oxide diameter devices are illustrated that compare plain VCSELs with VCSELs utilizing a dielectric layer 175. There is a slightly increased threshold current. The slope of the L-I curve is increased. There is no change in I-V since this is purely an optical phenomenon Referring to FIGS. 6-7, relative intensity is shown as a function of wavelength for plain VCSELs and VCSELs utilizing a dielectric layer 175. Spectral characteristics of devices before and after amorphous silicon deposition should differ at both same power and same current. In one example, devices with and without the exemplary filter were measured at different total output power to illustrate the mode suppression technique. The VCSELs utilizing a dielectric layer 175 were measured at a higher output power since it is significantly less ambiguous than measuring at the same current or even the same output power. In this example, if the modified device has less modes at the same or higher output power as an unmodified device then the modification can be said to work beyond the same power as the unmodified device. It was determined that VCSELs with the amorphous silicon filter experienced mode suppression compared to the smaller power for a plain VCSEL. The graphs clearly show mode suppression even to output powers above that of the plain VCSEL.

VCSEL 100 including dielectric layer 175 can be utilized with other techniques such as Zn-diffusion to control the loss and reflectivity of higher-order modes. Further, surface coatings including both metal and dielectric can be utilized to enhance the performance of disordered devices and allow further enhancement of single mode power.

Figure 8:
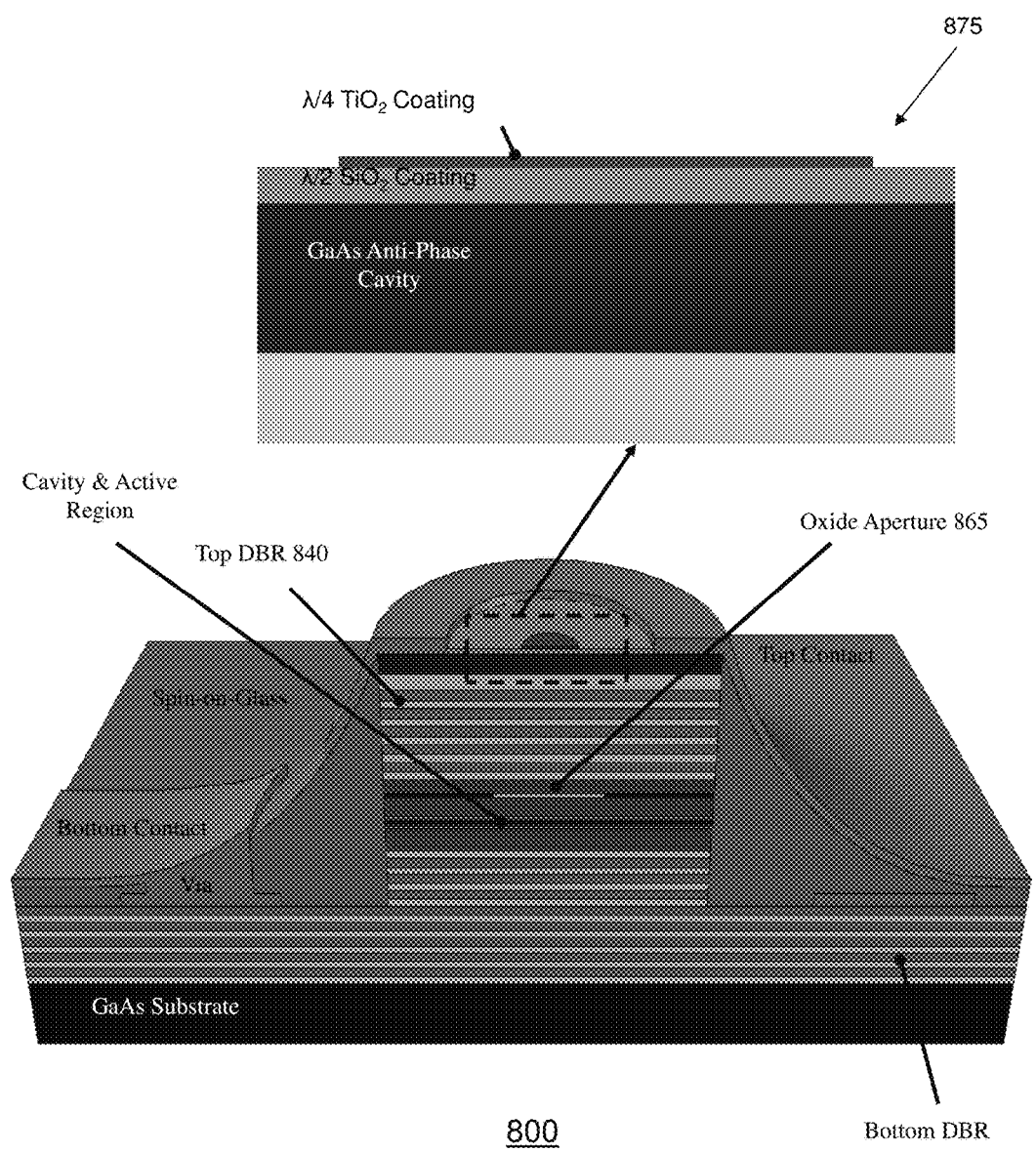
FIGS. 8-9 depict illustrative embodiments of a VCSEL having another dielectric filter for suppression of at least a first mode.
Figure 9:
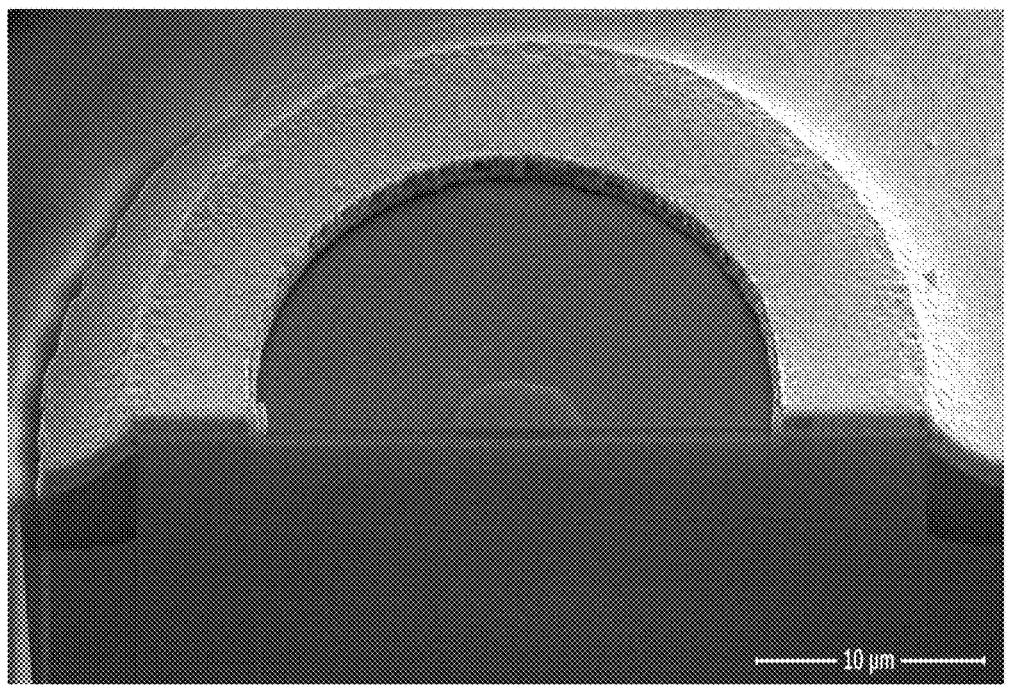

Referring to FIGS. 8-9, a VCSEL 800 is illustrated that utilizes a dielectric filter 875 that does not include an opening therethrough. The dielectric filter 875 can be positioned in a center of the upper distributed Bragg reflector 840. In one embodiment, the dielectric filter 875 can have a diameter (or dimensions) smaller or larger than the diameter (or dimensions) of the oxide aperture 865 and smaller than the diameter (or dimensions) of the upper distributed Bragg reflector 840. In one embodiment, the dielectric filter can include more than one layer, such as a lower layer of λ/2 silicon dioxide ($SiO_2$) and an upper layer of λ/4 titanium dioxide ($TiO_2$). In another embodiment, the multi-layer dielectric filter 875 can be disposed on a GaAs anti-phase layer.

Figure 10:
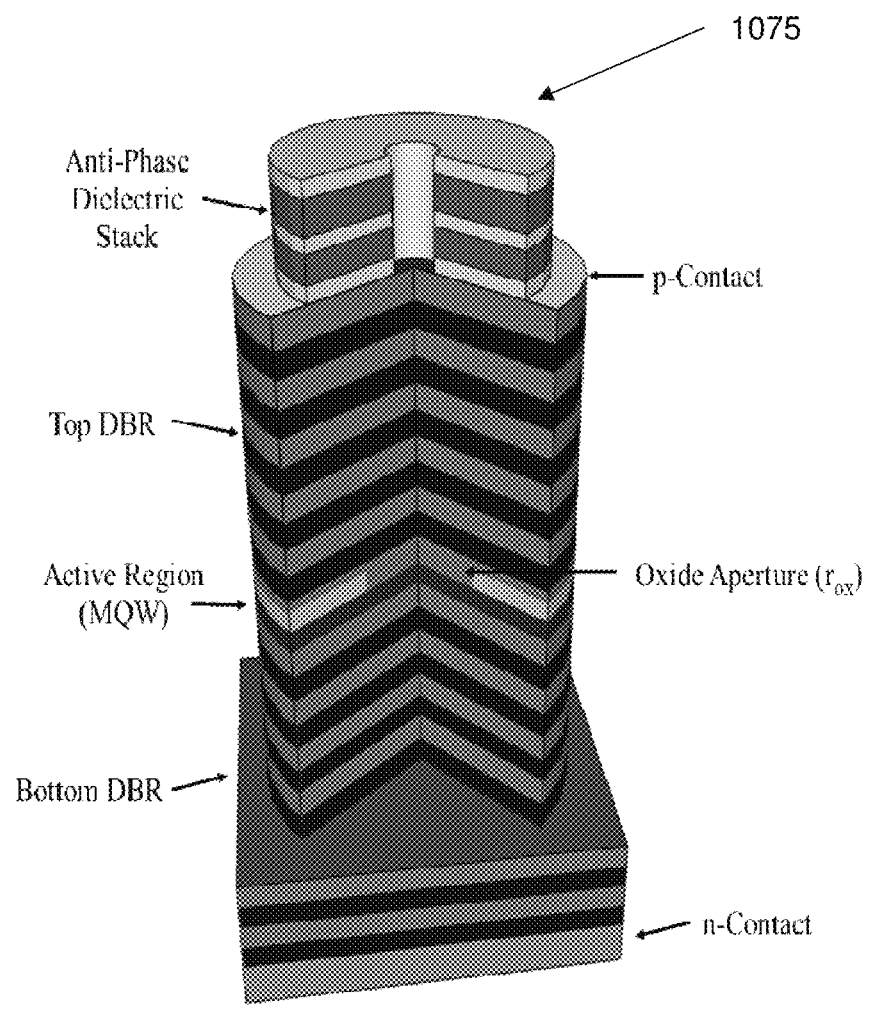
FIG. 10 depicts an illustrative embodiment of a VCSEL having another dielectric filter for suppression of higher modes.

Referring to FIG. 10, a quarter-wave dielectric stack 1075 can be utilized, which is formed by a non-destructive deposition process that can be applied on a previously fabricated VCSEL 1000. The dielectric stack 1075 can increase the threshold of higher order modes via a phase perturbation of the mode standing wave. If the refractive index of each of the dielectric layers is properly accounted for, the dielectric stack 1075 serves as an anti-phase mini-DBR cavity. If designed such that the dielectric stack 1075 is deposited only over areas of the VCSEL where the field intensity of the fundamental is minimal (or lower) and the field intensity of the higher order modes is maximum (or higher), the fundamental mode can remain relatively unaffected and single-mode lasing can be achieved from the VCSEL 1000 with oxide apertures that normally support many transverse modes. This example dielectric stack 1075 is a patterned five layer dielectric stack consisting of amorphous Si and silicon dioxide ($SiO_2$).

Figure 11:
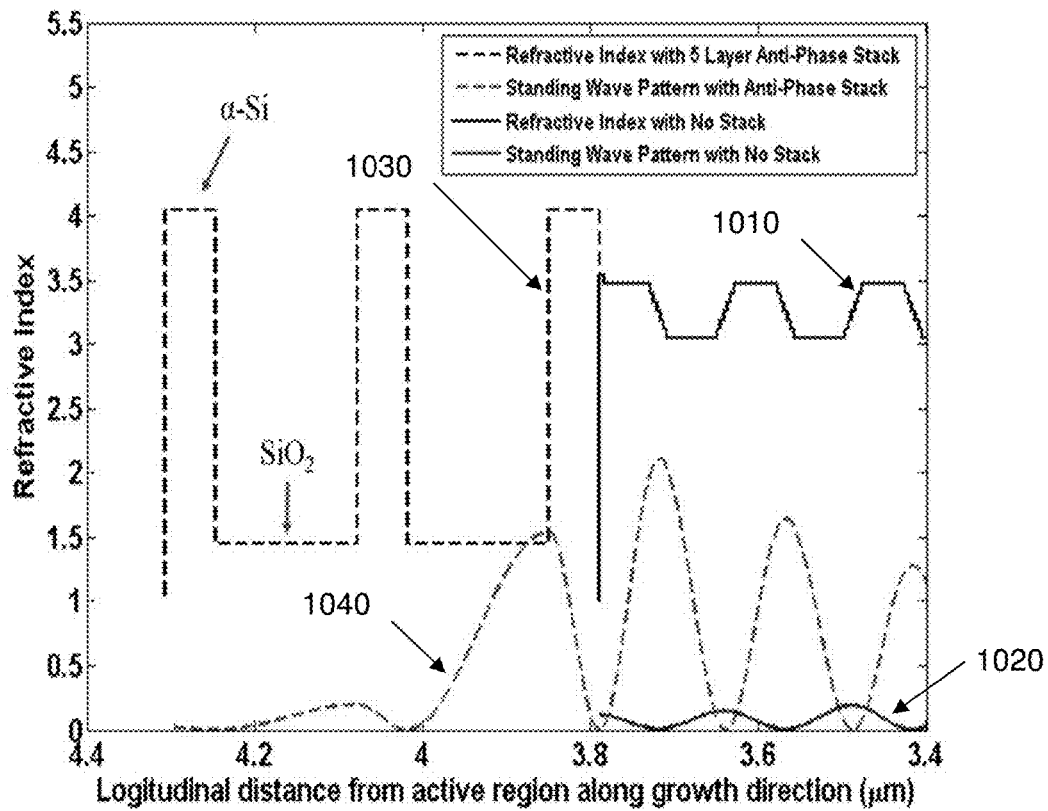
FIG. 11 depicts a graphical representation of refractive index (dashed black line) and standing wave pattern (red dashed line) for the VCSEL of FIG. 10 as well as a graphical representation of refractive index (solid black line) and standing wave pattern for (solid blue line) for a conventional VCSEL.

Referring to FIG. 11, large loss to higher order modes is implemented through the use of a λ/4 thick dielectric filter deposited on top of the VCSEL in another example. The dielectric filter is designed such that it perturbs the phase of any field that overlaps the region covered by the filter. When using a material such as amorphous silicon, having an index of around 4.048+0.02125i at a wavelength of 980 nm, the phase of the field can be perturbed at the semiconductor/a-Si interface. This arises from how the standing wave pattern is set up from the perspective of the $3\lambda/2$ or $\lambda/2$ cavity. When the first half DBR pair outside of a cavity of this length is the higher refractive index DBR half pair (as it is in the case of this layered structure), the field is set up such that an antinode occurs when going from a high refractive index half pair to low refractive index half pair, and a node occurs when going from a low refractive index half pair to a high refractive index half pair. Since the last layer before the VCSEL output is a high refractive index GaAs+ $Al_{0.12}Ga_{0.88}As$ hybrid half pair, the field formed at this semiconductor/air interface is at an antinode (see the solid lines in FIG. 11).

FIG. 11 illustrates the index of refraction for the top interface of a standard VCSEL layer structure without (line 1010) and with (line 1030) a multiple (five) layer anti-phase dielectric stack formed of $\lambda/4$ layers of amorphous silicon and silicon dioxide: $\alpha$-Si/SiO$_2$/$\alpha$-Si/SiO$_2$/$\alpha$-Si. The anti-phase stack perturbs the phase of the reflected wave by pi at each interface, forcing the field to a node (line 1040) instead of the typical antinode (line 1020). This results in a reduced power reflectivity for modes with transverse field profiles that significantly overlap the amorphous silicon layer, thus increasing the material gain needed to lase. When $\alpha$-Si is deposited on top of the semiconductor, from the perspective of the cavity, the semiconductor/dielectric interface is a low to high transition, meaning the field wants to form a node. The effect is attributed to a pi phase shift in the reflected wave from the incident wave (see line 1030 and line 1040 in FIG. 11).

Another important thing to note is that the anti-phase effect can be repeated at each subsequent interface after the first transition from the semiconductor to $\alpha$-Si. If only a single $\alpha$-Si layer is used, the field at the second interface, from $\alpha$-Si to air, will once again be an antinode. However, it is still $\pi$ out of phase when viewed from the cavity. The overall effect is the creation of an anti-phase wave propagating back towards the cavity. Though the amplitude of the anti-phase wave is small compared to the standing wave at the active region due to the small amount of field penetration into the twenty-three or more pairs of DBR that form the top mirror in this example, it is enough to slightly perturb the total standing wave pattern via destructive interference. If a second dielectric is used, SiO$_2$ in this example, an anti-phase cavity can be formed as long as the second dielectric has a lower index of refraction than the $\alpha$-Si and the destructive interference effect is compounded, resulting in a large decrease in reflectivity around the chosen wavelength despite the stack residing on top of a large number of DBR pairs.

Figure 12:
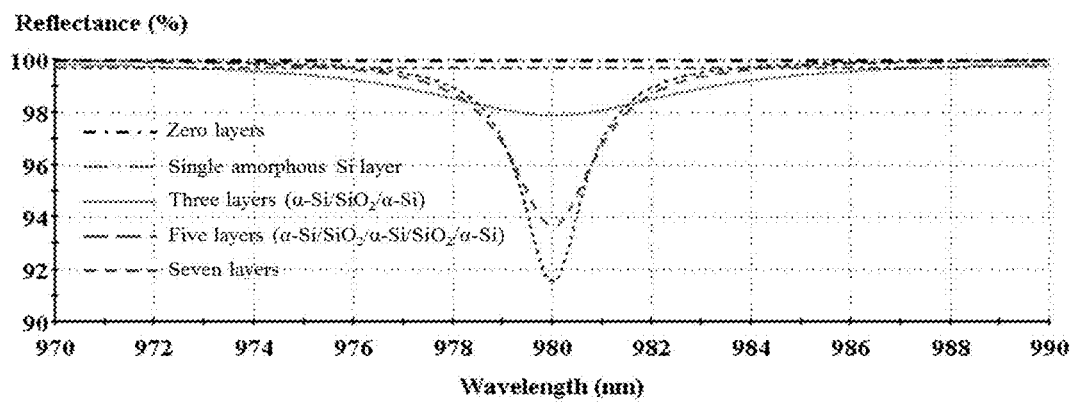
FIG. 12 depicts a graphical representation of reflectance as a function of wavelength for VCSELs with different number of dielectric filter layers associated with the VCSEL of FIG. 10.

As can be seen in FIG. 12, the top mirror reflectivity can be reduced below 98% using only a three layer anti-phase stack consisting of $\lambda/4$ thick layers of $\alpha$-Si and SiO$_2$. If the number of layers is increased, the bandwidth of the reflection dip is reduced but the reflectivity is even further decreased to below 94% for a five layer stack and below 92% for a seven layer stack. It is most important to note that this anti-phase stack can be deposited after the VCSEL has been fabricated and tested. This allows for an accurate determination of the thickness needed for each dielectric layer since the wavelength of the higher order modes is known via the device lasing spectrum. With no anti-phase layer, the reflectivity of 24 pairs of DBR is 99.98% at 980 nm as illustrated in FIG. 12. A single $\alpha$-Si layer decreases the reflectivity to 99.65%. If a three layer stack ($\alpha$-Si and SiO$_2$) is used, the reflectivity is 97.87%. Five and seven layer stacks result in a reflectivity of 93.67% and 91.53%, respectively.

In another embodiment, a lossy layer of metal can be deposited as a mode filter. This idea is an extension of the phase perturbation that the dielectric filter relies on for mode selection. When metal is deposited on the top of a VCSEL layered structure, it can form a secondary plasmonic cavity near semiconductor/metal interface and perturb the longitudinal standing wave in the laser. This results in an increase in threshold gain by slightly lowering the overlap between the mode and the gain region and decreasing the reflectivity of the overlapping modes, as well increases modal losses because of field perturbation into the lossy metal layer. However, if a single $\lambda/4$ layer is removed from the VCSEL before metal deposition, the standing wave and reflectivity is virtually unaffected because there is already a node at the plasmonic interface. The difference in these two interface conditions can be exploited to increase the threshold gain of higher-order modes while leaving the fundamental mode virtually unaffected.

Figure 13:
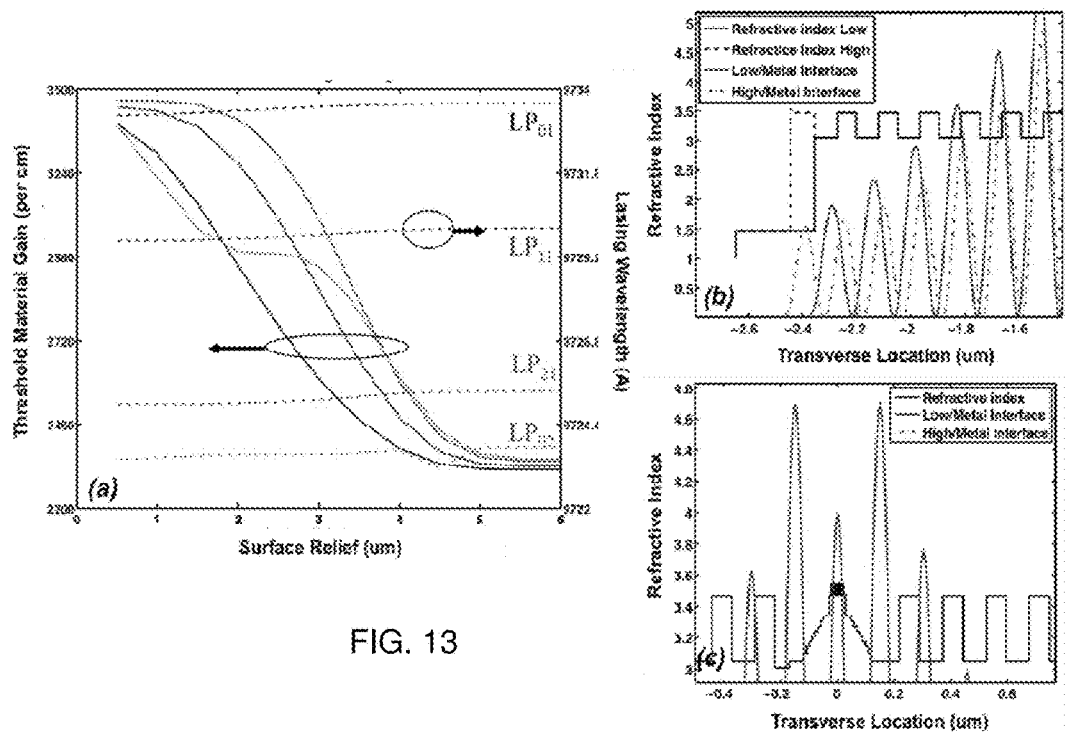
FIG. 13 depicts a graphical representation of threshold material gain as a function of surface relief radius and refractive index for a VCSEL subject to metallic surface relief.

In the case of a metallic surface relief structure, the additional loss imparted to the higher order modes comes from a higher electric field penetration into the lossy metal, a decreased reflectivity, and a slight misalignment of the longitudinal cavity mode with both the DBR interfaces and the gain region. A numerical calculation of this effect for a one dimensional structure is shown in FIGS. 13(a), using 13(b) and 13(c). In a full laser example, a first high-index DBR layer will be etched away before metal deposition to ensure minimal field perturbation in the region with highest overlap with the fundamental mode (center of pillar), whereas metal will be directly deposited on the high-index DBR layer in the regions that should have increased losses. There is an optimal radial distance of the etch to maximize mode selectivity while minimizing fundamental mode loss, given as 57% of the oxide aperture. The calculation of the difference in threshold material gain for the first four lasing modes as a function of surface relief radius is shown in FIG. 13(a). FIG. 13(a) illustrates a threshold gain and lasing wavelength of a 10 µm oxide aperture diameter VCSEL as a function of metallic surface relief size. FIG. 13(b) illustrates a longitudinal wave profile of VCSEL cavity showing the phase mismatch caused by the high-index/metal interface. FIG. 13(c) illustrates a zoomed view of an active region comparison between high-index/metal and low-index/metal interfaces.

Figure 14:
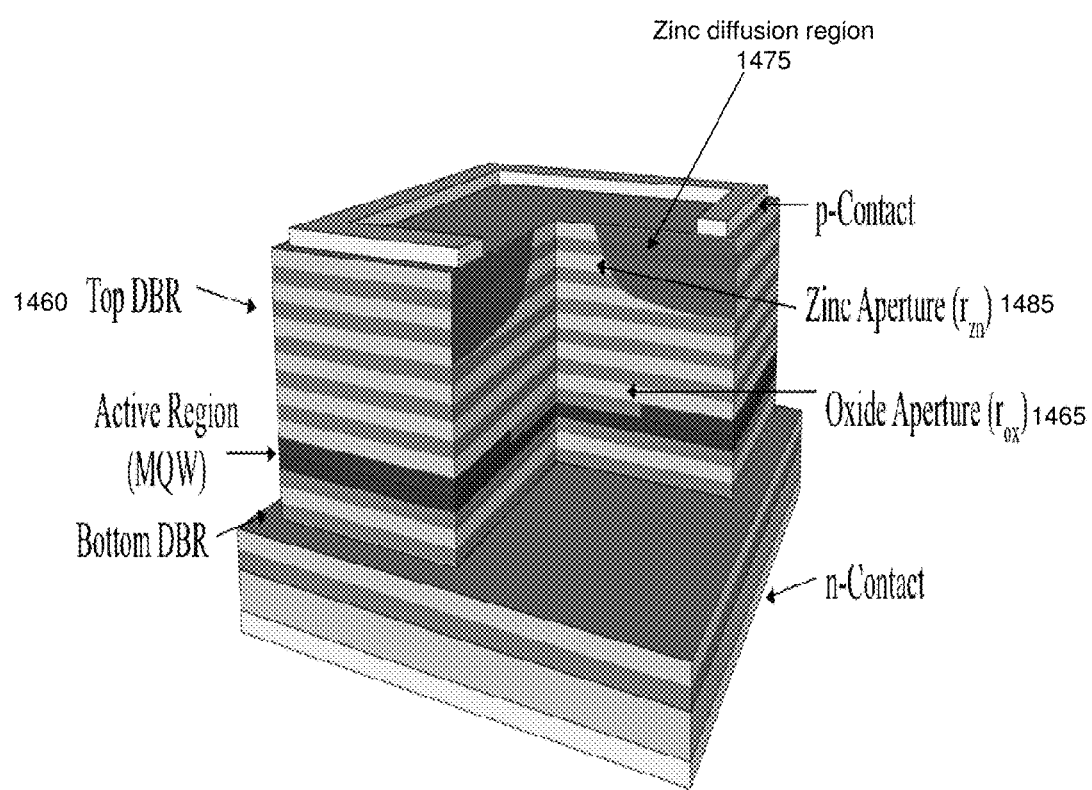
FIG. 14 depicts an illustrative embodiment of a VCSEL having a zinc diffusion region for suppression of higher modes.

Referring to FIG. 14, a VCSEL 1400 is illustrated that utilizes zinc diffusion to achieve single mode operation, such as for the realization of high-power (>50 mW) single-mode VCSELs. VCSEL 1400 utilizes Impurity-Induced Disordering (IID) to selectively intermix a defined number of layers in the VCSEL upper distributed Bragg reflector 1460 in spatially localized regions, thereby significantly increasing the threshold gain for undesired spatial modes. The primary mode-suppressing structure is a thin layer of zinc-diffused or Zn-implanted material 1475 that acts as a lossy anti-reflective layer on the emission surface of the VCSEL. In spatially-localized regions, reflectivity is lowered and free-carrier absorption is enhanced, lowering cavity "Q" for selected modes. The oxide aperture 1465 defines the transverse modes in the structure, and the zinc-diffused region 1475 serves to filter out the higher order modes by decreasing the reflectivity of the distributed Bragg reflector in the regions of peak transverse field intensity. The zinc diffusion region 1475 has penetrated into the upper distributed Bragg reflector 1460.

In one embodiment, rather than focusing on a phase mismatch to suppress higher order modes, a transverse position dependent reflectivity profile achieved by impurity induced disordering can be utilized. By disordering the top few pairs of DBR in specific locations along the transverse plane of the VCSEL 1400, the reflection spectrum of the top DBR will be diminished, increasing the threshold gain for modes with a large overlap in these areas. In another embodiment, this can be utilized with a phase mismatch layer, such as via a metal or dielectric layer or stack. Because the impurity induced disordering provides mode selectivity from within the DBR stack, additional mechanisms can be added to the surface in order to combine the effects.

Zinc diffusion presents an opportunity for mode selection in VCSELs. The threshold condition for each mode in a VCSEL is given by:

$$\Gamma g_{th} = \alpha_i + \alpha_m = \alpha_i + \frac{1}{2L}\ln\frac{1}{R_t R_b}$$

where $\alpha_i$ is the intrinsic loss of the laser and $\alpha_m$ is the mirror loss. Diffusion increases both $\alpha_i$ by introducing extra free carrier absorption and $\alpha_m$ by effectively "blurring" the DBR interfaces and decreasing their reflectivity. In this way, selectively diffusing into an area that maximizes overlap with higher-order mode profiles while minimizing the extra loss to the fundamental order mode can delay (or even remove) the onset of lasing in higher-order modes.

Figure 15A:
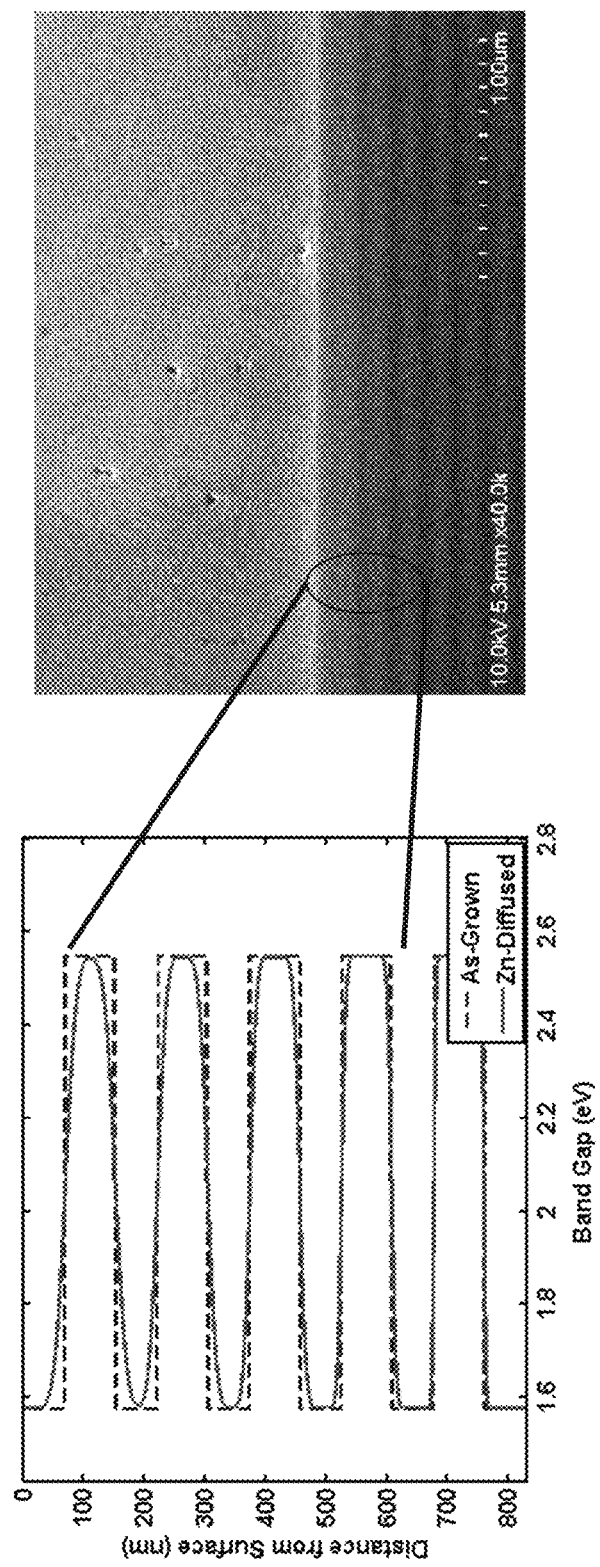
FIG. 15A illustrates the change in band gap of a disordered distributed Bragg reflector (DBR) profile (solid red line) along with the band gap of a conventional DBR profile and the corresponding scanning electron micrograph (SEM) of disordering in epitaxial AlGaAs DBR.
Figure 15B:
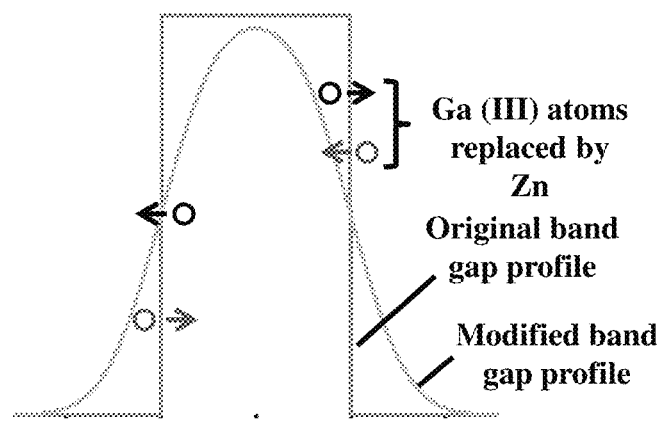
FIG. 15B illustrates a schematic diagram for the change in band gap of a single half-pair of DBR due to zinc diffusion and the mechanisms of zinc diffusion in the VCSEL of FIG. 14.

A scanning electron micrograph (SEM) and corresponding plot of smearing of the DBR interfaces due to zinc diffusion is shown in FIGS. 15A and 15B. In the SEM, the top-most two to three DBR pairs have been disordered due to the diffusion process, thus reducing their reflectivity. Power reflectivity is reduced for the top mirror (99.2% to 97.6%), increasing $\alpha_m$ by 3×. Free carrier absorption ($\alpha_i$) is increased in the outer regions.

In one embodiment, zinc diffusion in VCSELs to achieve high-power can utilize an active area much larger than a single-mode regime, requiring the zinc aperture to be optimized for maximum single-mode output. In one embodiment, the diffusion can cover about 50-60% of the oxide aperture. However, other dimensions can also be utilized in the exemplary embodiments.

VCSELs 100, 800, 1000 and 1400 operating as single-mode VCSELs can be utilized in applications ranging from laser printers to optical computer "mice" (e.g., position sensors), as well as other applications such as magnetic memory. These applications rely on the ability to fabricate low-cost lasers with reproducible results. The current single-mode approaches precise and expensive fabrication processes such as nanometer-accuracy etching and regrowth and are not viable for mass production. Zinc diffusion and ion implantation, on the other hand, offer reliable methods to produce modal selectivity in large area lasers.

In one or more embodiments, zinc diffusion can be replaced with ion-implantation. Disordering via implantation can be applied to VCSELs with photo-lithographically-defined implant masks. The low lateral straggle associated with ion implantation can further increase the reliability and consistency of the devices. VCSELs can utilize metal as a contact layer and heat sink. The exemplary VCSELs can be utilized in micro- and nano-sized lasers.

In one or more embodiments, because of the non-destructive nature of the zinc-diffusion and implantation, metallic surface relief and dielectric filter, they can be applied together or in series to the same VCSEL to increase or maximize single-mode output power and mode selectivity. The zinc-diffusion (or zinc implantation) occurs within the top mirror of the device, while the dielectric filter is a deposition, and the metallic surface relief acts on the bottom mirror, playing the role of contact metal, thermal heat sink, and mode selector. Because of the demands for such high power, the VCSELs can be pushed to larger and larger sizes to maximize gain area, and multiple filtering methods can be applied to obtain the desired performance of the VCSEL.

Figure 16:
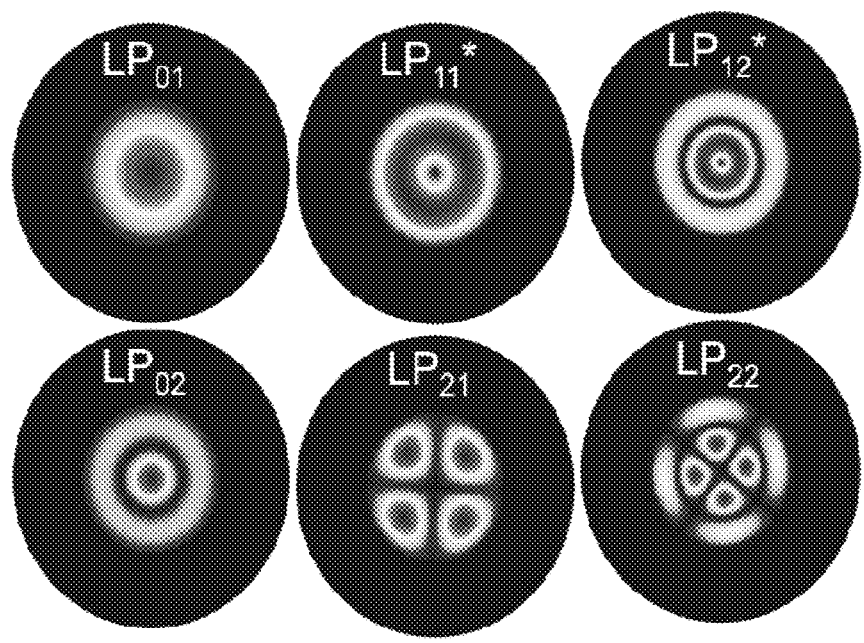
FIG. 16 illustrates the transverse intensity profiles of the first six linearly polarized lasing modes in a contemporary VCSEL.

In order to understand the filtering mechanism for the Zn-diffused VCSEL structure, it is useful to find the mode profile for the first few (six) lasing modes of a traditional VCSEL, as shown in FIG. 16. Notice that only the fundamental order mode has a significant portion of its lasing power near the direct center of the waveguide. Of course, the diffusion will change the index contrast between the diffused and non-diffused portions, but the modes shown provide a good approximation.

The motivation for most approaches to single-mode lasing is to modify the VCSEL to impart higher losses, whether they be intrinsic losses or mirror losses, in the regions corresponding to the largest field intensity of the higher-order mode profiles. In the case of zinc diffusion, the area where the fundamental mode has a peak can be masked with a dielectric and the sample can be sealed in a closed ampoule under vacuum with a ZnAs pellet. After heating the closed and vacuumed ampoule containing the sample and ZnAs pellet, the zinc then diffuses into the surface, disordering the areas not protected by the dielectric mask. This reduces the reflectivity of the DBR stack in these regions (intermixing four pairs of DBR results in a power reflectivity decrease from about 99% to 93%, providing significant increase in threshold modal gain) as well as enhancing free carrier absorption. In addition to providing selectivity, the zinc also serves to increase the conductivity of the top layers of DBR, reducing the risk of current crowding near the contacts and edges of the oxide aperture that is often prevalent in large-area devices. This can also lower the turn-on voltage of the diode. Some preliminary data showing these findings can be seen in FIG. 17 where Light-Current-Voltage characteristic for zinc-diffused VCSEL (solid) and traditional VCSEL (dashed) are illustrated and in FIG. 18 where near-threshold spectra for various Zn-diffusion apertures a, where a→∞ is taken to be a traditional VCSEL with no zinc diffusion. In these examples, all devices have a 44 μm mesa size with an 11.4 μm oxidation aperture width.

Figure 18:
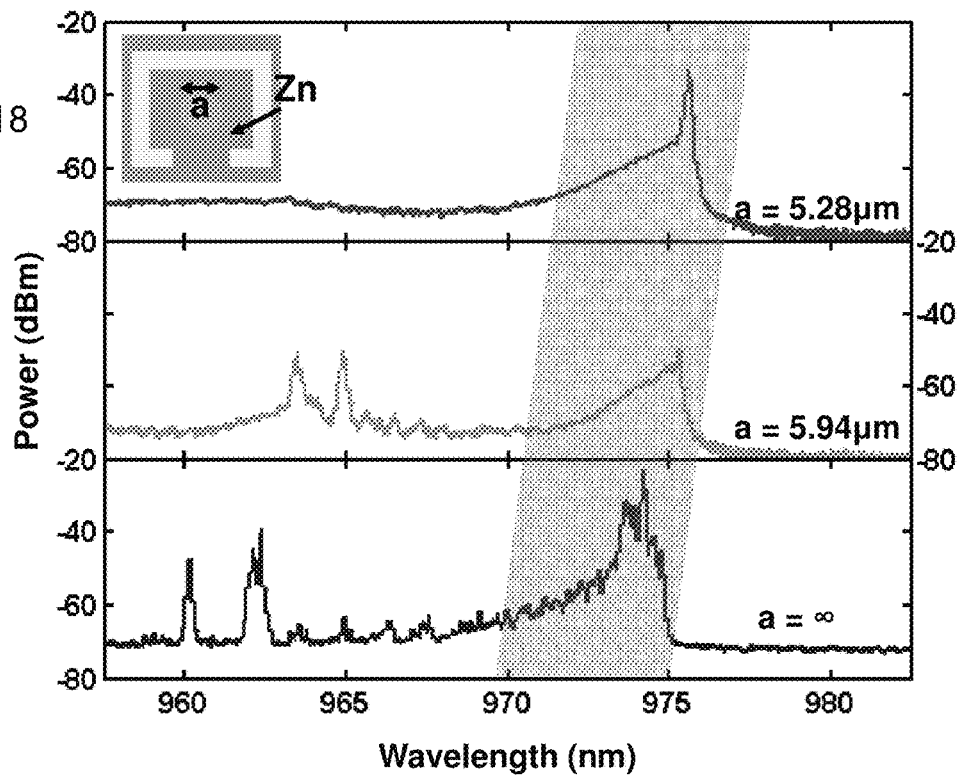
FIG. 18 depicts a graphical representation of a measurement of power versus wavelength (also known as a spectrum) for a VCSEL that utilizes a zinc diffusion region.

The spectra shown in FIG. 18 also demonstrate the effectiveness of the diffusion as a mode filter. In the case of no zinc (blue line at bottom portion of the graph), the near-threshold spectra shows many cavity modes as well as two modes at a lower wavelength that are higher order oxide modes of the VCSEL. As the zinc is added, the number of cavity modes supported decreases. And, finally, when the zinc diffusion aperture reaches just over 55% of the oxide aperture (red line at top portion of graph), only a single cavity peak remains and the peaks due to higher order oxide modes have disappeared. As all spectra were taken at threshold, the increase in magnitude of the fundamental peak demonstrates the larger number of carriers contributing to lasing in that mode. The maximum output power can increase when the device is bonded to a proper heat sink, staving off the onset of thermal rollover.

Figure 17:
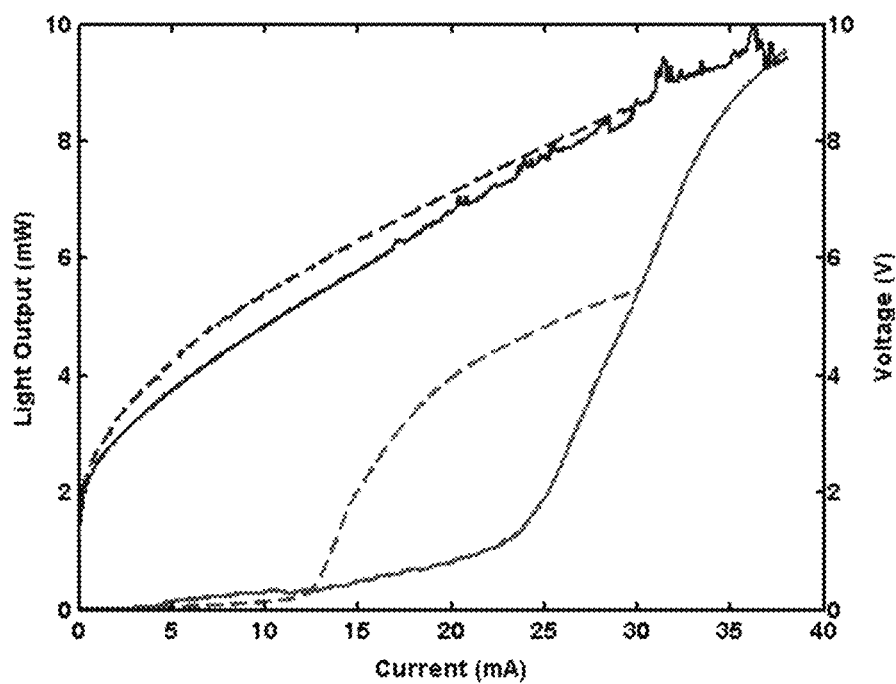
FIG. 17 depicts a graphical representation of light output versus current and voltage versus current for a contemporary VCSEL (dashed) and a VCSEL that utilizes a zinc diffusion region (solid)

In FIG. 17, the VCSEL having zinc diffusion (ZnSEL) illustrates a slight decrease in voltage compared to the traditional VCSEL, though both are quite high due to sub-optimal stoichiometry of the n-contact. The ZnSEL has larger threshold current from "smearing" of mirrors and free-carrier absorption, but lasing is located at the center of the cavity, indicating the fundamental mode lases first. The ZnSEL has suppressed thermal rollover onset, indicating less cavity heating. In FIG. 18, the Zn diffusion filter shown in the red curve at the top portion of the graph shows reduction in the number of cavity modes supported as well as filtering of the highly blue-shifted oxide modes seen in the blue line in bottom portion of graph. The minimal red-shift of the fundamental peak as the aperture size is decreased indicates the Zn filter does not perturb the refractive index of the structure enough to act as an entirely separate waveguide.

Figure 19:
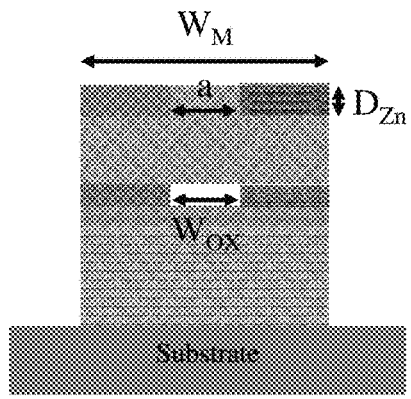
FIG. 19 depicts an illustrative embodiment of a VCSEL having another zinc diffusion region for suppression of higher modes.

Referring to FIG. 19, a schematic drawing of a VCSEL with Zinc diffusion is shown. Exemplary dimensions are shown including the width or diameter $W_M$ of the fabricated VCSEL mesa which consists of the upper distributed Bragg reflector, the width or diameter $W_{OX}$ of the oxide aperture, the width or diameter of the Zn diffusion aperture "a", and the depth of the zinc diffusion $D_{Zn}$. These are exemplary dimensions and other dimensions can be utilized depending on various factors including the desired parameters of the VCSEL and the materials being utilized.

Figure 20:
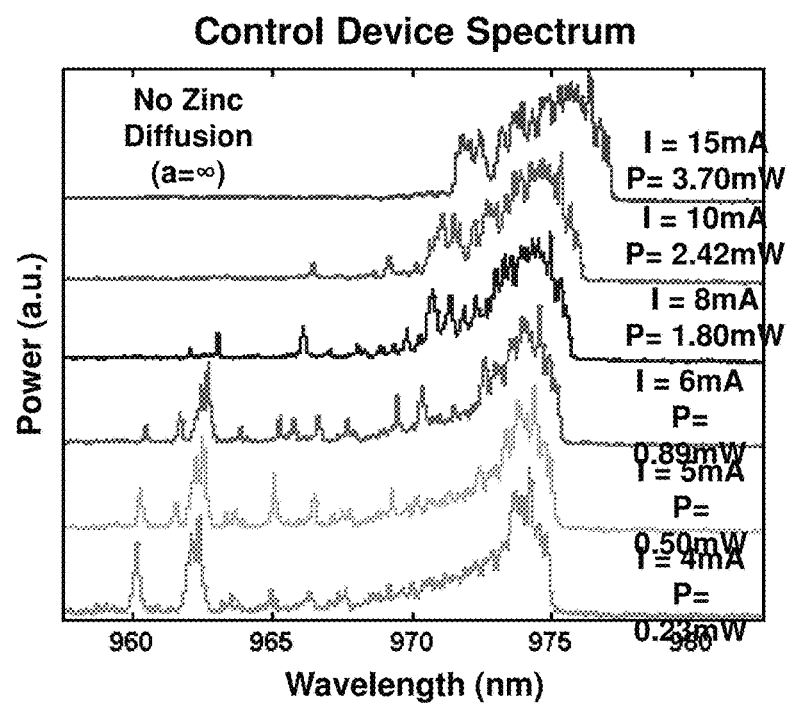
FIGS. 20-21 depict graphical representations of a measurement comparing the spectra for a VCSEL that utilizes a zinc diffusion region with a VCSEL that does not utilize a zinc diffusion region.
Figure 21:
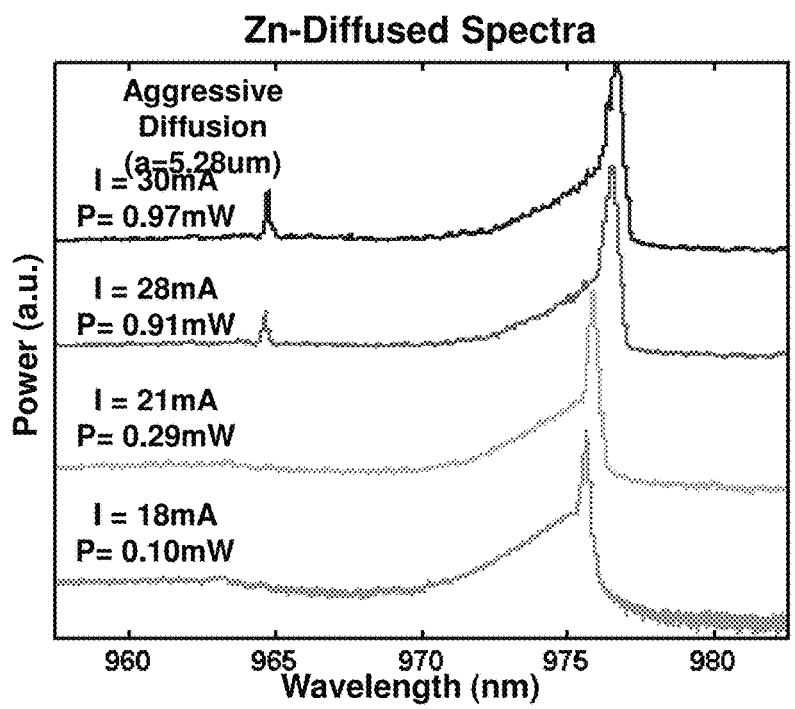

Referring to FIGS. 20-21, a comparison can be seen between a zinc-diffused spectrum (FIG. 21) and a control device (non-zinc diffused) spectrum (FIG. 20) based on relative power as a function of wavelength. The zinc-diffused VCSEL of FIG. 21 operates single-mode up to approximately twice the threshold current of the device ($-2I_{TH}$) while the control device is multimode immediately at lasing threshold.

Figure 22:
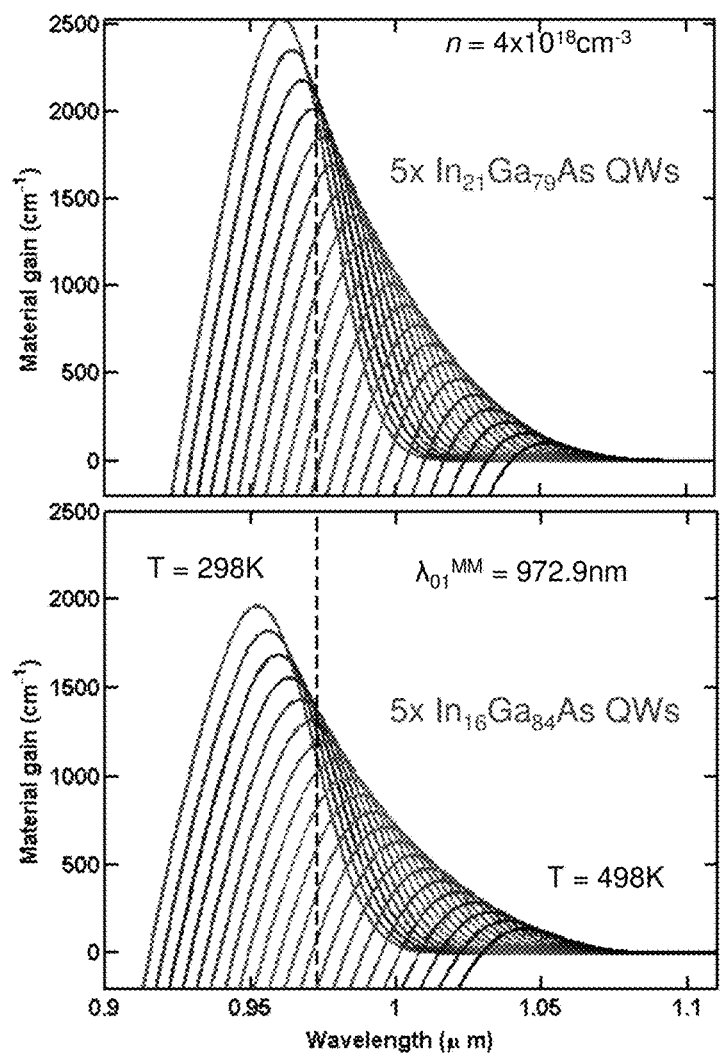
FIG. 22 depicts a graphical representation of material gain as a function of wavelength for exemplary VCSELs.

Referring to FIG. 22, material gain is illustrated as a function of wavelength for different semiconductors forming the quantum well gain region. Moving from left-to-right on each graph corresponds to an increase in temperature for a fixed carrier concentration, starting at a room temperature value of 298K. In the gain region, lower Indium mole fraction corresponds to a blue shift in the gain peak for all temperatures. The dotted black line corresponds to the wavelength of the fundamental $LP_{01}$ mode ($\lambda_{01}^{MM}$). Phosphorus can be removed from the quantum well barriers for increased thermal performance, which will also slightly shift the peak gain with respect to wavelength. In the cavity region, a $3\lambda/2$ cavity can be shortened to $\lambda/2$ for increased thermal extraction. The cladding region Aluminum mole fraction can be increased to provide more efficient carrier injection. For the mirrors, binary GaAs/AlAs bottom DBR can be utilized for more efficient thermal extraction and reduction in field penetration (thus, reduction in mode volume and absorption loss). One or more of the exemplary embodiments can achieve lower material gain for given T and n, thus decreasing threshold current and can be used in conjunction with one or more aspects of the subject disclosure to achieve better single-mode performance.

Figure 23:
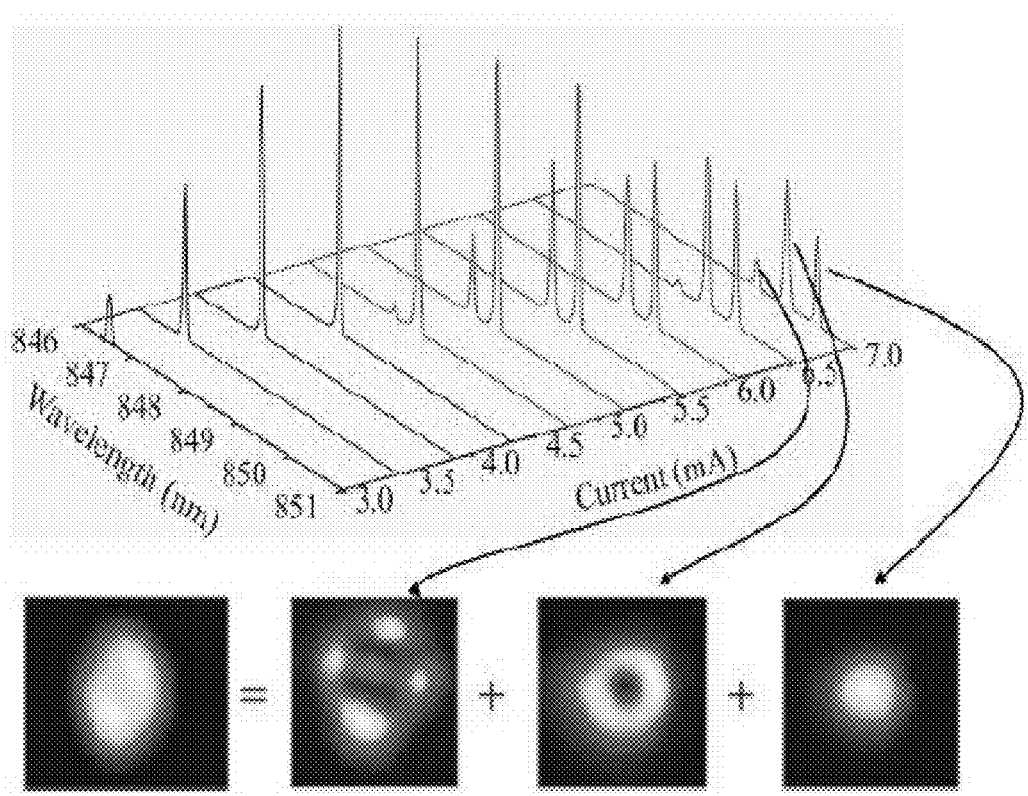
FIG. 23 depicts a graphical representation of the output spectra (relative intensity versus wavelength) and spatially resolved images for VCSEL transverse modes.

Referring to FIG. 23, VCSELs with useful aperture sizes typically support multiple transverse modes. Obtaining high output power from a VCSEL can necessitate a larger aperture size having multiple transverse modes. Most applications requiring or desiring high power also need single transverse mode operation. The exemplary embodiments described herein can suppress higher order modes without increasing series resistance or limiting current injection.

Figure 24:
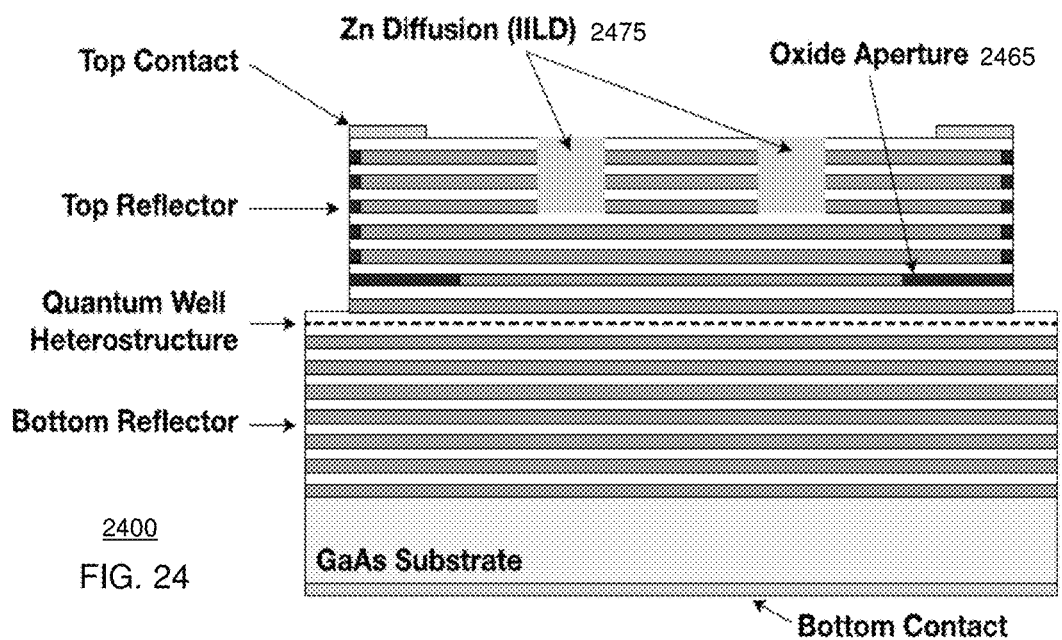
FIGS. 24-25 depict an illustrative embodiment of a VCSEL having another zinc diffusion region for suppression of higher modes.
Figure 25:
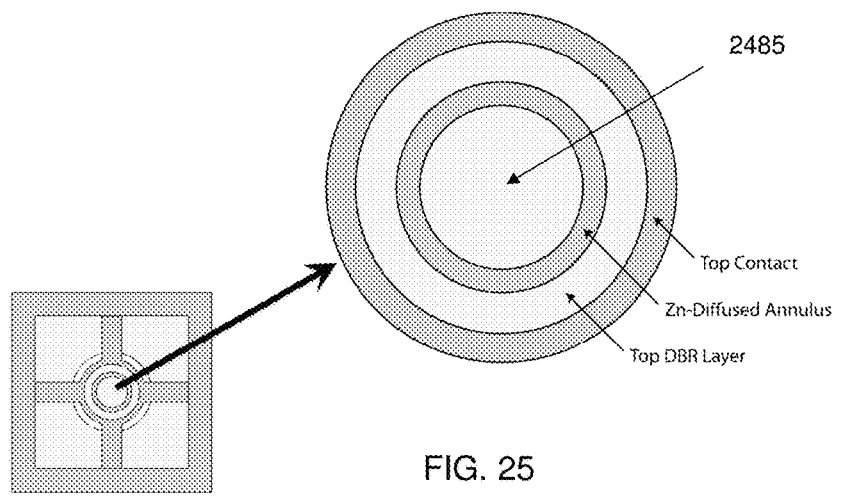

Referring to FIGS. 24-25, a VCSEL 2400 is illustrated that utilizes a zinc diffusion region 2475 having a ring or annular shape forming a zinc aperture (non-zinc diffused area) 2485. Various dimension (or diameters) can be utilized for the zinc diffusion region 2475 and the zinc aperture 2485, as well as the oxide aperture 2465. Zn-diffusion into the p-type top DBR is used to intermix the top mirror layers in selected areas. Localized mirror reflectivity is reduced, and the phase relationship of the reflected light from the top DBR is perturbed. The threshold gain for lasing on higher order modes increases relative to the fundamental mode, so the fundamental mode is favored. The Zn diffusion does not block current flow.

Figure 26:
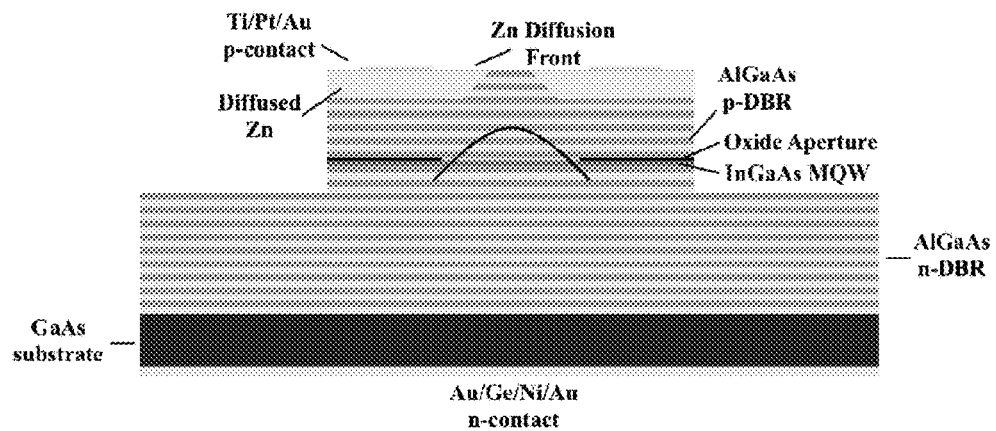
FIGS. 26-27 depict an illustrative embodiment of a VCSEL having another zinc diffusion region for suppression of higher modes along with an SEM image and a graphical representation of voltage versus current and light output versus current.
Figure 27:
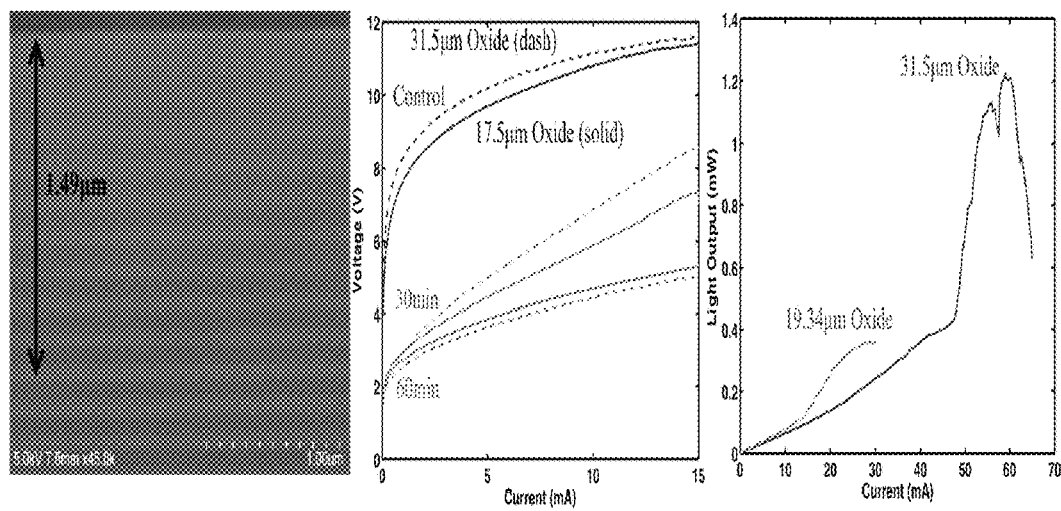

Referring to FIG. 26, a VCSEL 2600 is illustrated that includes zinc diffusion for suppression of higher order modes. In FIG. 27, the zinc diffusion depth is shown as well as the resulting data for voltage and light output as a function of current. Impurity induced layer disordering is utilized to reduce DBR reflectivity and increase free carrier absorption in lateral areas where higher order modes have peaks. Selecting appropriate zinc diffusion dimensions (e.g., width or depth) can result in a large difference in threshold gain between the fundamental and higher order modes, thus acting as a mode filter.

Figure 28:
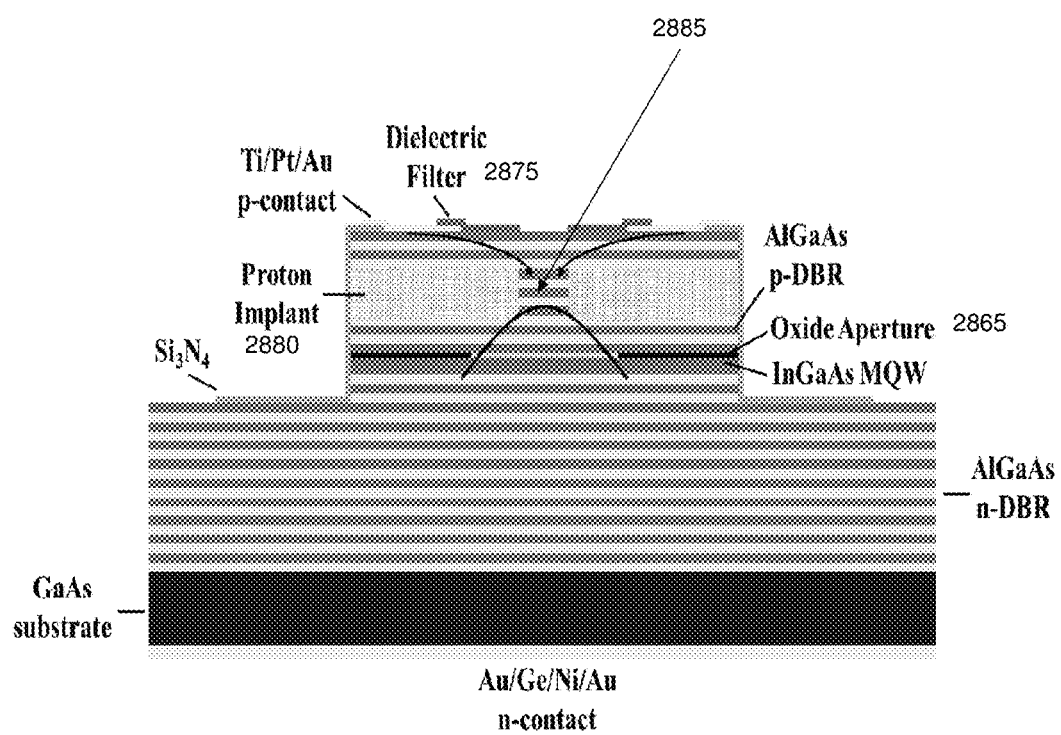
FIG. 28 depicts an illustrative embodiment of a VCSEL having another dielectric filter for suppression of higher modes, in conjunction with a highly resistive proton implanted region which serves to decouple the electrical and optical components of the VCSEL and improve modal output characteristics of the VCSEL.

Referring to FIG. 28, a VCSEL 2800 is illustrated in which post-process lithography and deposition of a dielectric filter 2875 (e.g., amorphous silicon) on a VCSEL is utilized for suppression of higher order transverse modes. VCSEL 2800 combines the dielectric filter 2875 with proton implant 2880 to further increase mode selectivity (i.e., suppression of higher order modes). Proton implantation with a proton aperture 2885 having a size smaller than the oxide aperture 2665 can decouple electrical and optical components, providing 'mode specific' carrier injection.

Figure 29:
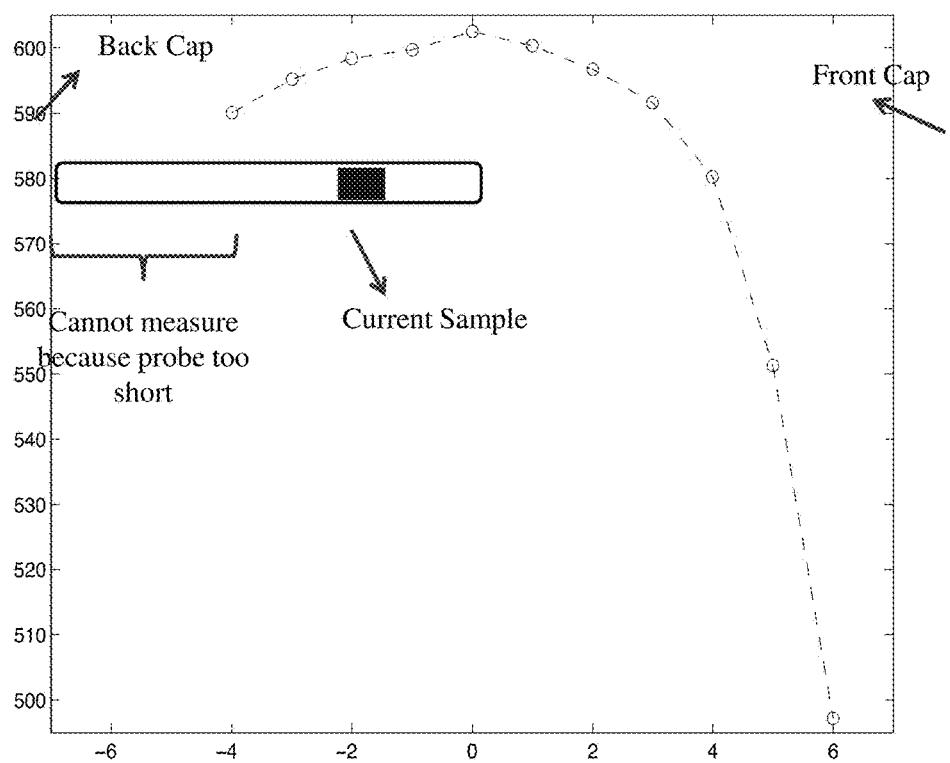
FIG. 29 depicts a temperature profile as a function of distance of a furnace for the manufacture of a VCSEL having zinc diffusion for suppression of higher modes.
Figure 30:
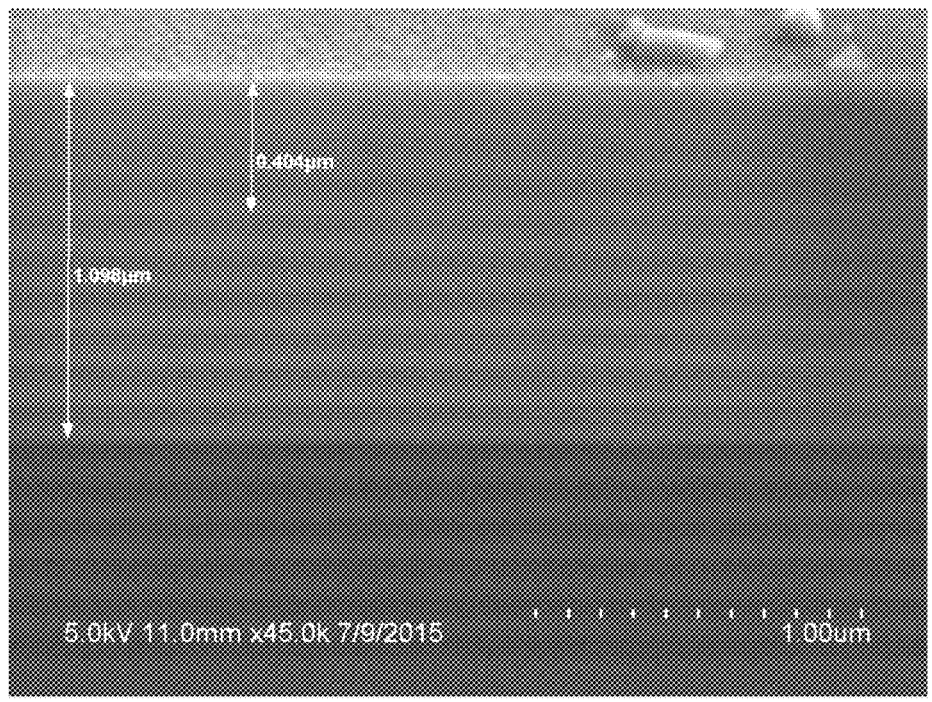
FIGS. 30-35 depict illustrative embodiments of SEMs of disordering in epitaxial AlGaAs DBR for VCSELs that are provided with a zinc diffusion region.
Figure 31:
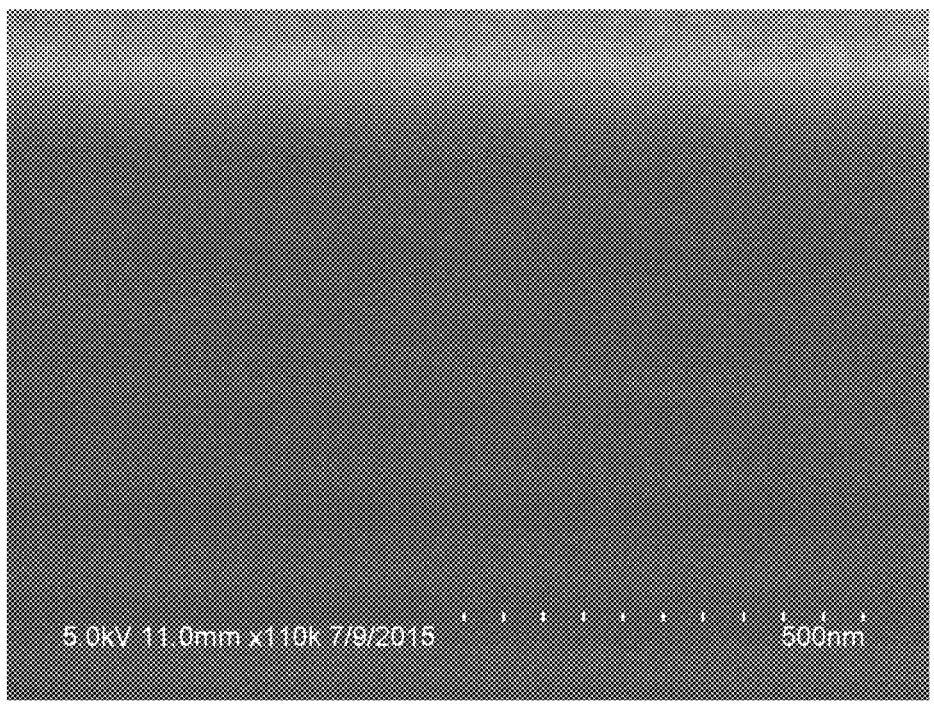
Figure 32:
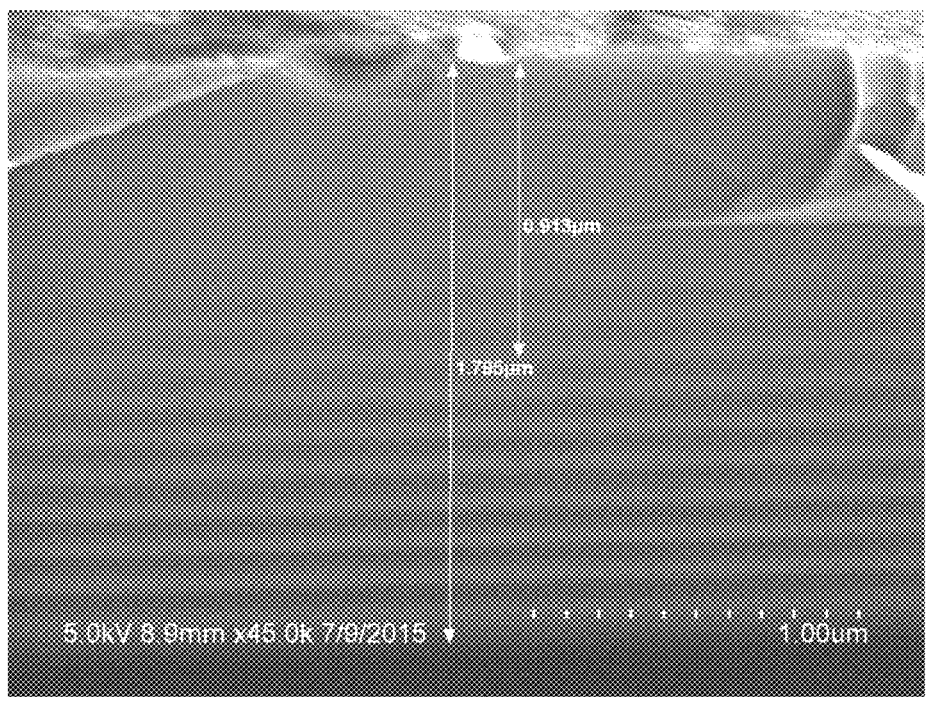
Figure 33:
Figure 34:
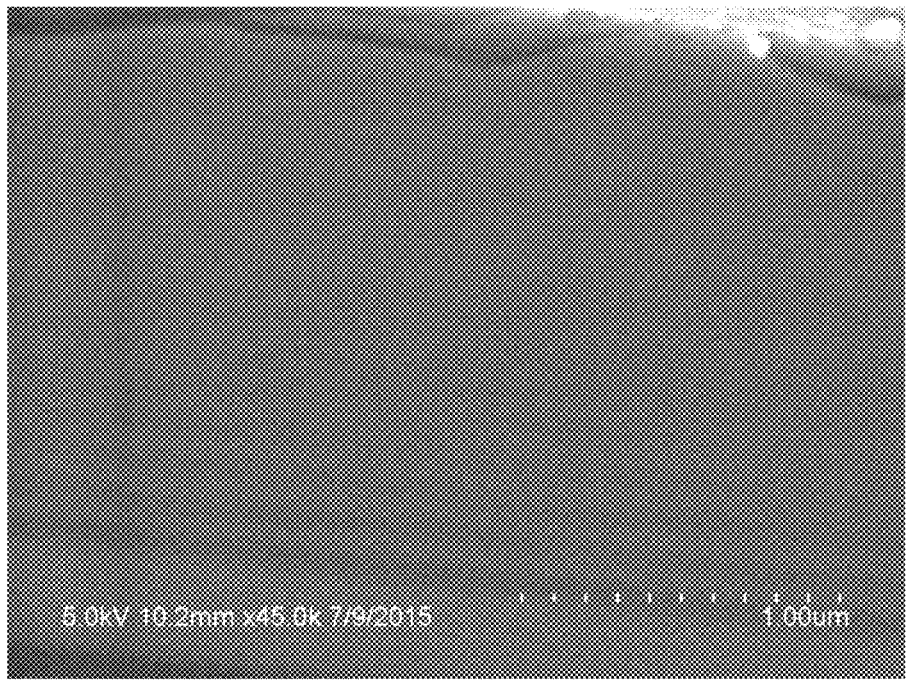
Figure 35:
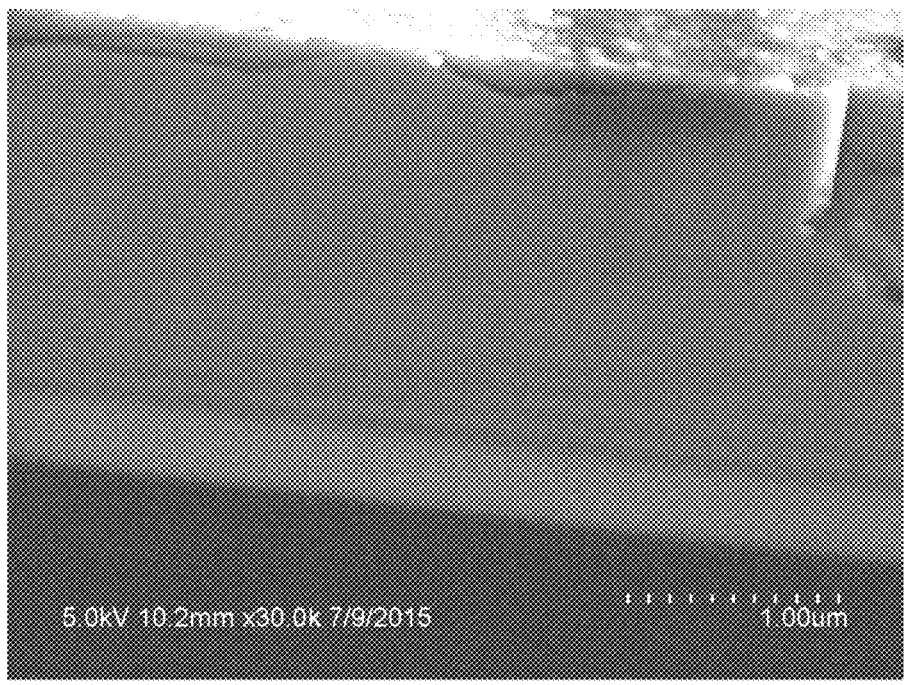

Referring to FIG. 29, manufacture of the VCSEL device can be improved, for single mode performance with notable high power, by disordering the interfaces of the distributed Bragg reflector in the regions where the higher order modes have electric field peaks, lowering the reflectivity of those higher order modes. In order to improve the performance of the Zn-diffusion method for mode control, more effective smearing of the mirror interfaces can be performed. For example, careful calibration of the furnace's temperature profile and gas flow rate can be performed. The inert gas, nitrogen in this case, flow rate can be decreased to reduce any temperature gradient between different parts of the sealed ampoule containing the sample and ZnAs pellet. Any temperature gradient along the sealed ampoule will result in uneven diffusion of zinc into the sample. Using a Type K thermocouple, the temperature profile of the furnace along the length of the furnace can be taken as shown in FIG. 29. Note that this was performed for a furnace temperature set point of 575 C (nominally 600 C inside the quartz tube located in the furnace itself). The method of inserting the sealed ampoule containing the sample and the ZnAs pellet into the furnace was modified to guarantee that the ampoule would sit in a portion of the furnace with minimal temperature variation, which is indicated by minimal variation in the blue temperature curve. Three diffusion tests were performed using a sample layered with 15 pairs of DBR similar to the DBR pairs on an actual VCSEL layer structure. The temperature set point of the furnace was changed for each of the diffusion tests, the values being: 575 C, 600 C, 625 C. The degree to which the interfaces are intermixed increases with diffusion temperature, as does the Zn diffusion depth. The SEM images for the zinc diffusion process are shown in FIGS. 30-35. FIGS. 30-31 are at 575 C, FIGS. 32-33 are at 600 C and FIGS. 34-35 are at 625 C. In one embodiment, calibration of the lateral diffusion depth can be performed so that the VCSELs are not "pinched off" by the Zn. This would result in minimal mode selection and poor efficiency.

One or more of the exemplary embodiments can be applied to devices, such as VCSELs, for mode suppression in the 850-980 nm range, as well as to devices in other wavelength ranges. This can include 1310/1550 nm VCSELs for data transmission over single-mode fiber and visible-spectrum VCSELs for lighting, display, and projector applications. The exemplary VCSELs can be used for high-speed data links, parallel optics and active optical cable, novel position sensors, and magnetic storage.

One or more of the exemplary embodiments can use currently available VCSEL wafers and bulk GaAs wafers, along with appropriate temperatures and times for the Zn diffusion process to optimize or improve a diffusion depth into the semiconductor. Characterization of the Zn profile can be done using techniques such as scanning electron microscopy (SEM) and secondary ion mass spectrometry (SIMS). In one or more embodiments, nitride deposition, photolithography, plasma descum, nitrite etch via RIE, resist stripping, and/or dry etching of $A_{1x}G_{a1-x}As$ via ICP can be applied to define mesa structures. An in-house closed ampoule process can be used to perform the zinc diffusion. An in-house wet oxidation process can be tailored to reliably produce VCSEL oxide apertures of proper sizes to maximize the effect of the impurity induced disordering on higher order modes. In one or more embodiments, dielectric filters can be formed via lithography and dielectric sputtering. During this task, bulk GaAs wafers can be used to determine the transmission and reflection spectra of the filters. The dielectric coating can be improved or optimized through deposition via thermal evaporation.

The exemplary embodiments, can utilize various materials and combinations of materials for the dielectric filter and/or other components of the VCSELs. As an example, the dielectric filter can be formed from amorphous silicon, $SiO_2$, MgF, and/or $TiO_2$.

Figure 36:
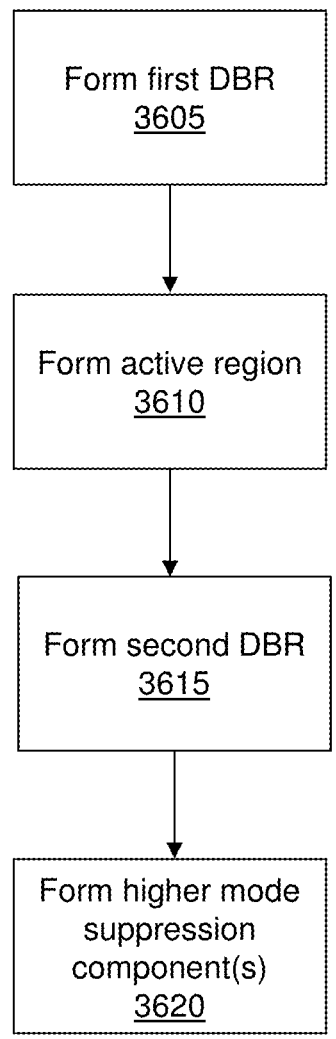
FIG. 36 depicts an illustrative embodiment of a method used to manufacture one or more of the VCSELs of FIGS. 1, 8, 10, 14, 19, 24, 26, and 28.

FIG. 36 depicts an illustrative embodiment of a method used by for forming or otherwise manufacturing VCSELs that suppress higher modes to enable the VCSEL to operate as a single mode device. In one or more embodiments, the technique or techniques utilized to suppress the higher modes can avoid or substantially avoid suppression of the fundamental mode during operation of the VCSEL. At 3605, a first distributed Bragg reflector can be formed or otherwise produced on or over a substrate. For example, the first distributed Bragg reflector can be an n-type distributed Bragg reflector that is formed on an n-contact or a GaAs substrate. At 3610, an active region can be formed or otherwise produced on or over the first distributed Bragg reflector. The active region can have an oxide aperture that is formed via a wet-oxidation process that oxidizes the outer portion of a layer of the active region without oxidizing the rest of the active region. At 3615, a second distributed Bragg reflector can be formed or otherwise produced on or over the active region. For example, the second distributed Bragg reflector can be a p-type distributed Bragg reflector.

At 3620, a higher mode suppression component or combination of components can be formed or otherwise added to the VCSEL. In one embodiment, a dielectric filter can be added to the VCSEL, such as via a deposition process. The size (e.g., diameter, width, thickness), shape, and/or materials of the dielectric filter can be selected so as to suppress a particular mode(s) (e.g., higher modes) while not (or substantially not) suppressing another mode(s) (e.g., a fundamental mode). The parameters of the dielectric filter including size, shape and/or material can be selected based on characteristics of the VCSEL, such as the size and/or shape of the oxide aperture of the VCSEL, and/or based on desired power output for the VCSEL when operating in a single mode. As an example, the dielectric filter can be a single layer of amorphous silicon that is deposited and patterned via a lithography, electron-beam evaporation, and lift-off process without utilizing any destructive processes, without requiring precise etching of the VCSEL's upper distributed Bragg reflector 140, without utilizing ion implantation, without utilizing a high temperature diffusion processes, and without utilizing epitaxial regrowth. The dielectric filter can be in various shapes (e.g., based on the shape of the VCSEL and the positioning of the modes that are to be suppressed) and/or can include one or more openings to avoid or otherwise reduce suppressions of a particular mode(s) (e.g., fundamental mode). The dielectric filter can be a multiple layer dielectric stack, such as alternating materials (e.g., amorphous silicon and $SiO_2$) in the stack.

In another embodiment, a zinc diffusion region can be formed or otherwise produced at a top portion of the second distributed Bragg reflector. The size (e.g., diameter, width, thickness) and shape of the zinc diffusion region (including the diameter or width of the zinc aperture defined by the zinc diffusion region) can be selected so as to suppress a particular mode(s) (e.g., higher modes) while not (or substantially not) suppressing another mode(s) (e.g., a fundamental mode). The parameters of the zinc diffusion region including size and/or shape can be selected based on characteristics of the VCSEL, such as the size and/or shape of the oxide aperture of the VCSEL, and/or based on desired power output for the VCSEL when operating in a single mode.

While for purposes of simplicity of explanation, the respective processes are shown and described as a series of blocks in FIG. 36, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

One or more of the exemplary embodiments, utilizes impurity-induced disordering to blur the interfaces between different semiconductor layers, which serves to reduce the reflectivity from these interfaces. In addition, the impurities add free carrier absorption, another type of loss. Thus, by using this disordering in only the areas of the laser where higher order modes propagate and not where the fundamental mode propagates, one or more of the exemplary embodiments can increase the loss for the higher order modes and either (i) suppress them from the cavity or (ii) delay their lasing threshold to very high injection current. Either would result in high-power single-mode output. One or more of the exemplary embodiments allow for broad-area VCSELs, which traditionally operate in the multi-mode regime, to become single mode. This will allow for tighter focusing of the beam in subsequent optical paths; e.g., an energy-assisted magnetic recording apparatus. One or more of the exemplary embodiments allow for higher powers because they can provide mode filtering even when the lasing area is large enough to support many more modes. One or more of the exemplary embodiments provides a Zn-diffused filter that can be varied across a large range of sizes (e.g., from about 30% to 100% of the oxide aperture size) to identify (e.g., experimentally) the best size for filtering. One or more of the exemplary embodiments provides Zn-diffused devices that are large area (e.g., greater than 5 um) devices, which do not inherently operate in the single-mode regime.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. The exemplary embodiments can include combinations of features and/or steps from multiple embodiments. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

Less than all of the steps or functions described with respect to the exemplary processes or methods can also be performed in one or more of the exemplary embodiments. Further, the use of numerical terms to describe a device, component, step or function, such as first, second, third, and so forth, is not intended to describe an order or function unless expressly stated so. The use of the terms first, second, third and so forth, is generally to distinguish between devices, components, steps or functions unless expressly stated otherwise. Additionally, one or more devices or components described with respect to the exemplary embodiments can facilitate one or more functions, where the facilitating (e.g., facilitating access or facilitating establishing a connection) can include less than every step needed to perform the function or can include all of the steps needed to perform the function.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A vertical-cavity surface-emitting laser device, comprising:
   a first distributed Bragg reflector;
   a second distributed Bragg reflector;
   an active region with an oxide aperture between the first and second distributed Bragg reflectors; and
   one or more dielectric layers positioned above the second distributed Bragg reflector, wherein a positioning of the one or more dielectric layers with respect to the first and second distributed Bragg reflectors and the oxide aperture causes suppression of first or higher modes of the vertical-cavity surface-emitting laser device.

2. The vertical-cavity surface-emitting laser device of claim 1, wherein the one or more dielectric layers comprise amorphous silicon.

3. The vertical-cavity surface-emitting laser device of claim 1, wherein a p-contact layer is disposed between the one or more dielectric layers and the second distributed Bragg reflector.

4. The vertical-cavity surface-emitting laser device of claim 1, wherein the one or more dielectric layers are concentrically aligned with the oxide aperture.

5. The vertical-cavity surface-emitting laser device of claim 4, wherein the one or more dielectric layers comprise a dimension smaller than a corresponding dimension of the second distributed Bragg reflector.

6. The vertical-cavity surface-emitting laser device of claim 5, wherein the one or more dielectric layers have different dielectric material, wherein a first diameter of the one or more dielectric layers are larger than a second diameter of the oxide aperture.

7. A method of forming a vertical-cavity surface-emitting laser device, the method comprising:
   forming a first distributed Bragg reflector on a substrate, the first distributed Bragg reflector being an n-type distributed Bragg reflector;
   forming an active region on the first distributed Bragg reflector, the active region having an oxide aperture;
   forming a second distributed Bragg reflector on the active region, the second distributed Bragg reflector being a p-type distributed Bragg reflector; and
   forming one or more dielectric layers on the second distributed Bragg reflector, and
   wherein a positioning of the one or more dielectric layers with respect to the first and second distributed Bragg reflectors and the oxide aperture causes suppression of first or higher modes of the vertical-cavity surface-emitting laser device.

8. The method of claim 7, wherein the one or more dielectric layers comprise amorphous silicon.

9. The method of claim 7, wherein the forming of the one or more dielectric layers further comprises forming the one or more dielectric layers without epitaxially growing an additional semiconductor layer.

10. The method of claim 7, wherein the forming of the one or more dielectric layers further comprises forming the one or more dielectric layers without utilizing a precise etching process.

11. The method of claim 7, wherein the forming of the one or more dielectric layers further comprises forming the one or more dielectric layers according to a pattern based on a function of the oxide aperture.

12. A surface-emitting laser device, comprising:
a first distributed Bragg reflector;
a second distributed Bragg reflector;
an active region disposed between the first and second distributed Bragg reflectors and comprising an oxide aperture; and
one or more dielectric layers positioned above the second distributed Bragg reflector, and
wherein a positioning of the one or more dielectric layers with respect to the first and second distributed Bragg reflectors and the oxide aperture causes suppression of at least a first mode of the surface-emitting laser device.

13. The vertical-cavity surface-emitting laser device of claim 1, wherein the one or more dielectric layers correct an anti-phase layer in the second distributed Bragg reflector.

14. The vertical-cavity surface-emitting laser device of claim 1, further comprising a dielectric filter formed above the one or more dielectric layers.

15. The vertical-cavity surface-emitting laser device of claim 1, wherein the one or more dielectric layers are formed by a non-destructive deposition process.

16. The method of claim 7, wherein the one or more dielectric layers are formed to correct an anti-phase layer in the second distributed Bragg reflector.

17. The method of claim 7, further comprising forming a dielectric filter on the one or more dielectric layers.

18. The method of claim 7, wherein the forming of the one or more dielectric layers further comprises forming the one or more dielectric layers by a non-destructive deposition process.

19. The surface-emitting laser device of claim 12, wherein the one or more dielectric layers correct an anti-phase layer in the second distributed Bragg reflector.

20. The surface-emitting laser device of claim 12, further comprising a dielectric filter formed above the one or more dielectric layers.

* * * * *